US006567837B1

(12) United States Patent
Robinson

(10) Patent No.: US 6,567,837 B1
(45) Date of Patent: May 20, 2003

(54) OBJECT ORIENTED PROCESSOR ARRAYS

(75) Inventor: Jeffrey I. Robinson, New Fairfield, CT (US)

(73) Assignee: IQ Systems, Westborough, MA (US)

( * ) Notice: Subject to any disclaimer, the term of this patent is extended or adjusted under 35 U.S.C. 154(b) by 0 days.

(21) Appl. No.: 09/003,684

(22) Filed: Jan. 7, 1998

Related U.S. Application Data

(60) Provisional application No. 60/036,526, filed on Jan. 28, 1997.

(51) Int. Cl.[7] .............................................. G06F 17/00
(52) U.S. Cl. ......................... 709/1; 709/315; 709/316; 712/10; 712/11; 712/15
(58) Field of Search ........................... 709/1, 315, 316; 712/10, 15, 11

(56) References Cited

U.S. PATENT DOCUMENTS

| | | | | |
|---|---|---|---|---|
| 3,611,307 A | * | 10/1971 | Podvin et al. ............... 710/244 |
| 4,325,120 A | * | 4/1982 | Colley et al. ................ 711/202 |
| 4,598,400 A | * | 7/1986 | Hillis ............................ 370/400 |
| 4,773,038 A | * | 9/1988 | Hillis et al. .................... 703/20 |
| 4,814,975 A | * | 3/1989 | Hirosawa et al. ............... 709/1 |
| 4,827,403 A | * | 5/1989 | Steele et al. ................... 703/21 |
| 5,095,427 A | * | 3/1992 | Tanaka et al. ................... 709/1 |
| 5,095,522 A | * | 3/1992 | Fujita et al. ................. 709/316 |
| 5,129,077 A | * | 7/1992 | Hillis ............................ 712/13 |
| 5,165,018 A | * | 11/1992 | Simor .......................... 709/222 |
| 5,201,049 A | * | 4/1993 | Shorter ............................ 709/1 |
| 5,390,336 A | * | 2/1995 | Hillis ............................ 712/22 |
| 5,535,406 A | * | 7/1996 | Kolchinsky .................. 712/10 |
| 5,553,291 A | * | 9/1996 | Tanaka et al. ................... 709/1 |
| 5,572,680 A | * | 11/1996 | Ikeda et al. ................. 709/243 |
| 5,640,584 A | * | 6/1997 | Kandasamy et al. ......... 712/206 |
| 5,692,193 A | * | 11/1997 | Jagannathan et al. ........... 709/1 |
| 5,896,520 A | * | 4/1999 | Ohminato et al. ............... 709/1 |
| 5,898,855 A | * | 4/1999 | Onodera et al. ................ 709/1 |
| 5,978,570 A | * | 11/1999 | Hillis .......................... 711/200 |
| 6,058,466 A | * | 5/2000 | Panwar et al. .................. 709/1 |
| 6,397,242 B1 | * | 5/2002 | Devine et al. ................. 703/27 |

OTHER PUBLICATIONS

Gannon et al. "User Guide for a Portable Parallel C++ Programming System, pC++". Nov. 21, 1994.*
Dekeyser et al. "Irregular Data–Parallel Objects in C++". Internet. 1996.*

* cited by examiner

Primary Examiner—St. John Courtenay, III
Assistant Examiner—Lewis A. Bullock, Jr.
(74) Attorney, Agent, or Firm—David P. Gordon; David S. Jacobson; Thomas A. Gallagher

(57) ABSTRACT

An object oriented processor array includes a library of functional objects which are instantiated by commands through a system object and which communicate via a high level language. The object oriented processor array may be embodied in hardware, software, or a combination of hardware and software. Each functional object may include a discrete hardware processor or may be embodied as a virtual processor within the operations of a single processor. According to one embodiment, the object oriented processor array is formed on a single chip or on a single processor chip and an associated memory chip. When several objects are instantiated on a single chip, pins may be assigned to each object via a high level command language. Methods and apparatus for allocating memory to instantiated objects are disclosed. Methods and apparatus for scheduling when several virtual processors are embodied within the operations of a single microprocessor are also disclosed.

20 Claims, 15 Drawing Sheets

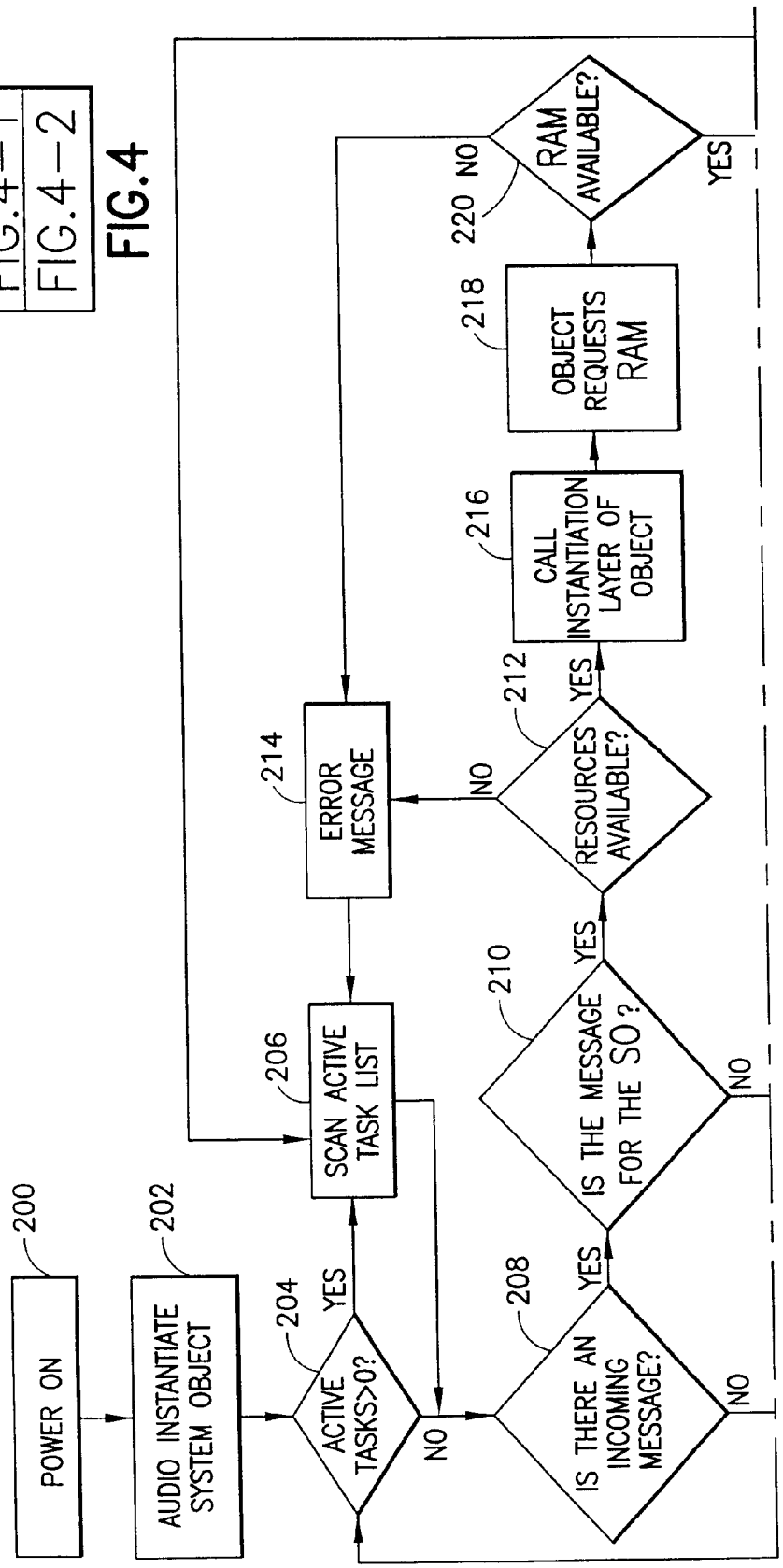

OBJECT ORIENTED PROCESSOR ARRAYS

This application claims the benefit of provisional application Ser. No. 60/036,526 filed Jan. 28, 1997 for "Object Oriented Processors With Enhanced Application Directed Flexibility".

This application is related to application Ser. No. 08/525,948, filed Sep. 8, 1995 for "Distributed Processing Systems Having A Host Processor And At Least One Object Oriented Processor", now U.S. Pat. No. 5,708,838 issued Jan. 13, 1998 and application Ser. No. 08/683,625, filed Jul. 17, 1996 for "Method And Apparatus For Distributed Processing And Rapid ASIC Development", now U.S. Pat. No. 6,072,944 issued Jun. 6, 2000, the complete disclosures of which are hereby incorporated by reference herein in their entireties.

This application is also related to co-pending applications Ser. No. 09/004,174 filed Jan. 7, 1998 for "Event-Reaction Communication Protocol in an Object Oriented Processor Array", now U.S. Pat. No. 6,052,729 issued Apr. 18, 2000, and Ser. No. 09/003,993 filed Jan, 7, 1998 for "Central and Distributed Script Servers in an Object Oriented Processor Array" (IQS-015), both filed simultaneously herewith, and the complete disclosures of which are hereby incorporated by reference herein.

BACKGROUND OF THE INVENTION

1. Field of the Invention

The invention relates to object oriented processors and processor systems. More particularly, the invention relates to an object oriented processor or processor system which utilizes a library of selectable processor objects in order to implement an array of processor objects. Although not limited thereto, the processors or processor system is preferably arranged such that the processor objects are self-instantiated in virtually any combination, and the processors or processor system is controlled by a high level scripting language.

2. State of the Art

Modern computers permit seemingly simultaneous execution of many operations by interrupting the microprocessor periodically to execute several software threads in turn. For example, as a user types on a keyboard, the input from this peripheral to the microprocessor is seemingly simultaneously displayed by the microprocessor on a video display peripheral. In reality, the microprocessor is interrupted periodically from displaying output on the video display in order to obtain input from the keyboard. It is only because the microprocessor operates at a very high speed that there is an illusion of simultaneity. In a more complex processing system, there may be many threads vying for microprocessor attention at any time. For example, in a desktop multimedia computer, several peripheral devices must be controlled by the microprocessor in a seemingly simultaneous manner in order to produce the proper results and different operations such as displaying video and playing audio must be handled by separate threads. The programming environment in a system having so many threads is incredibly complex. The system software must be written to schedule microprocessor attention to each thread, assign priority to each thread and allow peripherals to interrupt the microprocessor at appropriate times. The system software must then schedule tasks for the microprocessor in response to the interrupts from various peripherals.

In addition to scheduling problems, software in a multitasking (multi-threaded) system is difficult to debug. Single stepping techniques cannot be used, since different threads may depend on the results of other threads, and only a single thread can be operational during single stepping.

The handling of interrupts by the microprocessor is determined in part by the bus protocol and in part by the design of the microprocessor itself. Typically, the bus is designed to work with a particular microprocessor or group of microprocessors; and peripheral devices are designed to work with a particular bus. Moreover, each microprocessor-bus system handles interrupts in a different way. This makes it difficult, if not impossible, to adapt program code used on one microprocessor-bus system for use on another.

In order to relieve the host processor from performing every task, multiprocessor systems have been proposed. Some multiprocessor systems are successful in dividing tasks among processors when the tasks are well defined. For example, it is not uncommon to divide tasks between a data processor and a signal processor in systems which deal with signals and data in real time. It is more difficult to divide data processing tasks among several data processors. The operating system must decide which tasks will be performed by which processor and must schedule tasks so that processors do not remain idle while waiting for new tasks or while waiting for other processors to complete tasks so as to provide needed results. Consequently, there has been very little success in developing a general purpose multiprocessor system and there is no standard programming language for programming a multiprocessor system.

U.S. Pat. No. 5,095,522 to Fujita et al. discloses an object-oriented parallel processing system which utilizes "concept objects" and "instance objects". The system utilizes a host processor and a plurality of general purpose processors which are programmed by the host processor. The host user must program (generate concept and instance objects) for each processor before parallel processing can begin. Fujita et al. considers this aspect of their system to be a feature which allows dynamic changes in the functionality of each of the processors. However, this aspect of their system greatly complicates the host processor software.

Similarly, U.S. Pat. No. 5,165,018 to Simor describes a system in which "nodes" are provided with generic configuration rules and are configured at runtime via resource definition messages from the control node. Simor considers this aspect of his system to be an advantage which, among other things, "isolates the hardware from the software" and "allows programs to be written as if they were going to be executed on a single processor." In addition, Simor's system permits programs to be "distributed across multiple processors without having been explicitly designed for that purpose."

Both Fujita et al. and Simor utilize general purpose processors and attempt to isolate the hardware from the software, freeing the programmer to write code as if it were being executed on a single processor. However, as mentioned above, writing multithreaded software for a single processor is very complex. Neither Fujita et al. nor Simor offer any solution for this complexity.

3. Related Inventions

Related application Ser. No. 08/525,948 approaches the problem of distributed processing in a manner which is completely different from that of either Fujita et al. or Simor. The system disclosed in the '948 application utilizes processors which have been pre-programmed with functionality for a specific purpose and thereby integrates hardware with software. The developer chooses specific hardware (object oriented processors) in a manner similar to choosing specific software objects. This approach requires that the developer be very aware of the hardware used in the system, but frees the developer from writing much of the code used to implement the system. Accordingly, the developer need only write a minimal amount of relatively high level code to link the pre-programmed object oriented processors which contain statically stored code for performing specific tasks. This approach is based on the belief that writing and de-bugging code is more time consuming and more expensive than linking together processors which contain pre-written, bug-free code. This approach enables rapid system development, relieves the host processor of many scheduling tasks, simplifies de-bugging, enables cross-platform support, allows software emulation of hardware devices, as well as providing other advantages.

According to the '948 application, object oriented processors communicate with each other and/or with the host processor via the exchange of high level messages. This earliest implementation of the communication protocol required that the host poll at least some of the object oriented processors (i.e. those responsible for processing input data) to determine the availability of data. This was eventually found to detract from the goal of simple coding as the host code had to be written in a manner that would scan all possible input sources on a frequent basis. It was eventually decided that this polling created an undesirable overhead and coding complication. Since many of the originally developed object oriented processors operated in real time, the polling scan rate could be high and thus the overhead could be substantial. In addition, the early communication protocol did not provide information about the source of the data. This was instead derived by specific information requests by the host. Thus, several message exchanges might have been required before both data and source were determined.

Related application Ser. No. 08/683,625 discloses a distributed processing system one or more object oriented processors are embodied as a collection of components on a single ASIC chip. This related application includes an enhanced communication language where the host need not poll the object oriented processors and where messages from one processor to another include source and destination addresses. This communication protocol can be said to be "event driven".

In both of the related applications, each object oriented processor has a functionality which defines its physical connectability. More specifically, as embodied on a single chip, each object oriented processor (or collection of object oriented processors) presents a number of pins for coupling the processor to other devices. According to previously disclosed embodiments of the object oriented processors, the functionality of each pin is substantially fixed at the time the object oriented processor is manufactured. For example, as disclosed in related application Ser. No. 08/525,946, a user interface controller ultilizes thirty-seven pins, most of which have a set functionality. Several of the pins have alternate functionality. For example, pins A0 through A7 are an aux port. However, pins A1 and A2 can be used as LCD enable pins and pins A3–A7 can be used as LED enable pins. Nevertheless, for the most part, the functional resources of the object oriented processors are pre-defined with respect to certain pins and cannot be substantially changed by the developer/user.

SUMMARY OF THE INVENTION

As used herein, the term "object oriented processor array" means a collection of object oriented processors where each object oriented processor incorporates a separate hardware processor, or a collection of object oriented processors where each object oriented processor is embodied as a virtual processor sharing the same hardware processor, or any combination of discrete hardware processors and virtual processors.

It is therefore an object of the invention to provide an object oriented processor array with enhanced post-manufacture configurability.

It is also an object of the invention to provide an object oriented processor array on a chip having a number of pins where the functionality of the pins is configurable by a developer/user.

It is another object of the invention to provide an object oriented processor array which contains a library of functionality which may be selected in virtually any combination.

It is a further object of the invention to provide an object oriented processor array which contains a library of functionality which may be assigned to pins via software commands.

Another object of the invention is to provide an object oriented processor array which utilizes memory in an efficient manner.

In accord with these objects which will be discussed in detail below, an object oriented processor array of the present invention includes a readable memory containing a library of configurable (programmable) functions (also referred to as objects) and a writable memory in which objects are instantiated and configured. More specifically, the object oriented processor array includes a system functionality (system object) which is automatically instantiated in writable memory at power-up, which calls other objects to be instantiated in writable memory in response to commands from a host processor or a boot ROM, and which maintains an active task list and other information about instantiated objects. The object oriented processor array according to the invention further includes a communications interface, an input message processor, and an output message processor. The communications interface allows the object oriented processor array to communicate with other object oriented processor arrays and/or with a host processor. The output message processor preferably includes an external output flow manager for handling messages from processor objects in the array to processor objects external of the array, and a central output registry for queuing messages. According to a presently preferred embodiment, the object oriented processor array is embodied as a virtual machine which is formed from software which runs on a microprocessor. Therefore, the software which embodies the object oriented processor array is provided with a timing kernel which simulates parallelism and a memory manager which allocates memory to objects when they are instantiated.

According to a presently preferred embodiment of the invention, the library of functions is configured as a library of objects stored in ROM. Each object includes a parser layer, a functional layer (which preferably includes a runtime layer and a background layer), a time layer, and an instantiation layer. The system object is also stored in ROM and is automatically instantiated in RAM when the processor array is powered on, and in a preferred embodiment of the invention, reserves RAM for an active task list table (function pointers to instantiated objects), an active task list name table (the names of the instantiated objects), and an active task list data space (pointers to the allocated memory blocks for each instantiated object). The system object is similar to the other objects but handles global methods and functions which are common to all objects and essentially consists of a parser layer only. The most important function of the system object is to call on objects to instantiate themselves.

In response to a high level command from a host processor (or a boot ROM), the system object calls the instantiation layer of an object in the object library and commands the object to instantiate itself in RAM. The instantiation layer of the object calls the memory manager and requests an allocation of RAM. The memory manager returns a pointer (to a starting address in RAM) to the object. According to one embodiment, the object returns the pointer to the system object after performing any necessary initializations to complete instantiation. After the object informs the system object that instantiation was successful, the system object stores a pointer in the active task list table to the portion of the ROM in which the object resides. Each pointer in the active task list is associated with an index number. The system object also stores the name of the instance of the object in the active task list name table which associates the name with the same index number, and stores the pointer to the allocated memory block in the active task list data space which is also associated with the same index number. The system object then recomputes the scheduling of objects in the active task list. According to another embodiment, each instantiated object stores the pointer to its allocated RAM in a reserved area of RAM.

The instantiated object arranges its allocated RAM in several parts. The first part is the output message header which includes a pointer to the output buffer of the object instantiation, the message length, the active task list index, the flow priority of the cell instantiation, the message type, and the source ID. This first part is common in all objects, i.e. every instantiated object has this part in its allocated RAM. The second part is private data used by the cell in the performance of its functionality. This second part may be different for each instantiated object and some objects may arrange additional parts of allocated RAM. Once an object has been thus instantiated, physical pins can be assigned to the instantiation of an object by sending a high level command from a host processor (or boot ROM) to the instantiated object.

The input message processor checks the syntax of all incoming messages, buffers the message, examines the command and looks at the active task list name table to determine the index number for the instantiated object to which the command is directed, and passes the message and the index number to the parser layer of the object. The object parser layer interprets the pin assignment message and stores the pin assignment in its private data area of RAM for the named instantiation of the object.

According to other preferred aspects of the invention, objects may be instantiated several times so long as enough hardware resources (pins and RAM) are available to support another instantiation. The system object keeps track of all object instantiations by placing entries in the active task list table, the active task list name table, and the active task list data space table. In addition, the memory manager maintains a pointer to the memory heap which is utilized and generates an error message if requested to assign more RAM than is available. After pins have been assigned to an instantiation of an object, a message flow priority can be assigned. According to a presently preferred embodiment, a flow priority of 0–7 may be assigned where 0 represents polled priority and 1–7 indicate increasing levels of importance. When the priority level is greater than zero, output messages from the object will be generated autonomously. The flow priority is stored by the instantiation of an object in its output message header part of RAM. During initialization, the system object initiates a global variable or counter indicating the number of active tasks =0. Each time an object is instantiated, this variable is incremented. When the variable is >0, the system object returns control to the timing kernel which scans the active task list. Each time an object is instantiated, all active tasks are stopped and all instantiated objects are called to their timing layer and the tasks are scheduled. The system object assigns an offset to each object instantiation which the timing layer stores in private data. The object returns a worst case time to the system object and the worst case time is used to calculate the offset for the next active task. The time between the worst case and the actual time is advantageously used by the system object for system (background) functions; i.e. system functions are not otherwise scheduled and therefore do not require overhead.

During operation, a message to a particular instantiation of an object is parsed by the input message processor which scans the active task list name table to find the index to the active task list the pointer to the object instantiation addressed. The object receives the message from the input message processor and the index. The object uses the index and the active task list data space table to find which instantiation of itself is being addressed. Messages from an instantiation of an object are placed in the output message header part of its RAM and a request for registration is sent to the central output registry. The output registry maintains a queue of pointers to messages in output message header parts. The queue is scanned by one or more output flow managers which form output messages from the information held in the output message header parts.

According to other preferred aspects of the invention, a high level language is provided for communication between object oriented processors and a host processor during set-up and during operation. According to a presently preferred embodiment, the high level language messages are exchanged in packets of variable length with a well defined header. The header includes addressing information, an indication of the type of message which follows, an indication of the method or data type, and an indication of the length of the remaining data in the packet. The high level language is self-aligning, simple, and robust.

As mentioned above, the object oriented processor arrays according to the invention are embodied in many alternative constructions including running software on a microprocessor, field programmable gate arrays, multiple microprocessors, and other hardware devices.

Additional objects and advantages of the invention will become apparent to those skilled in the art upon reference to the detailed description taken in conjunction with the provided figures.

BRIEF DESCRIPTION OF THE APPENDICES

The enclosed CD-ROM appendix is incorporated herein by reference. The CD-ROM is in ISO 9660 Macintosh® format and includes the following Adobe® Acrobat® files:

| List of files | Size (Bytes) | Date of Creation |
| --- | --- | --- |
| app-a.pdf | 9,548 | Mar. 25, 2002 |
| app-b.pdf | 27,959 | Mar. 25, 2002 |
| app-c.pdf | 12,164 | Mar. 25, 2002 |

The file app-a.pdf is an exemplary source code listing for the timing kernel which includes main1001.c, and Timer2.c. This file is referred to herein as Appendix A.

The file app-b.pdf is an exemplary source code listing for the communications interface and message processors which includes Globals.h, Comms.c, Imsgproc.c, and Omsgproc.c. This file is referred to herein as Appendix B.

The file app-c.pdf is an exemplary source code listing for an exemplary processor object (Enc4.c). This file is referred to herein as Appendix C.

DETAILED DESCRIPTION OF THE PREFERRED EMBODIMENTS

Figure 1:
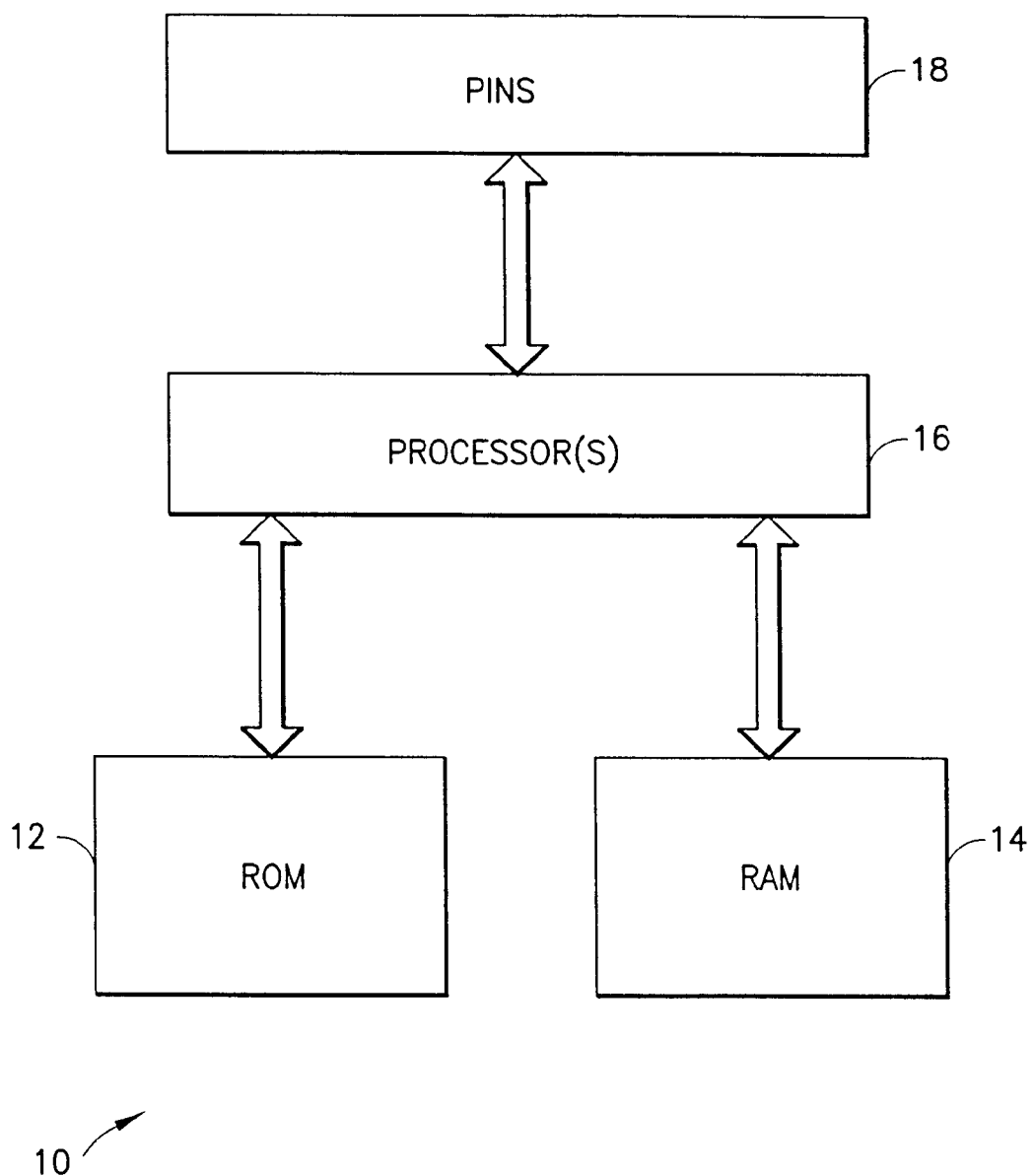
FIG. 1 is a schematic block diagram of the major hardware components of an object oriented processor array according to the invention.

Referring now to FIG. 1, an object oriented processor array 10 according to a presently preferred embodiment of the invention includes a readable memory 12, a writable memory 14, one or more programmable processors 16 coupled to the memory 12 and 14, and a real world interface such as a number of pins 18 which are coupled to the processor(s) 16. As shown and described in further detail below, one embodiment of the invention resides on a single chip which includes a single general purpose microprocessor, RAM and ROM and which has a number of pins. Those skilled in the art will appreciate, however, that the functional aspects of the invention may be embodied using many different types of hardware and/or software.

Figure 2:
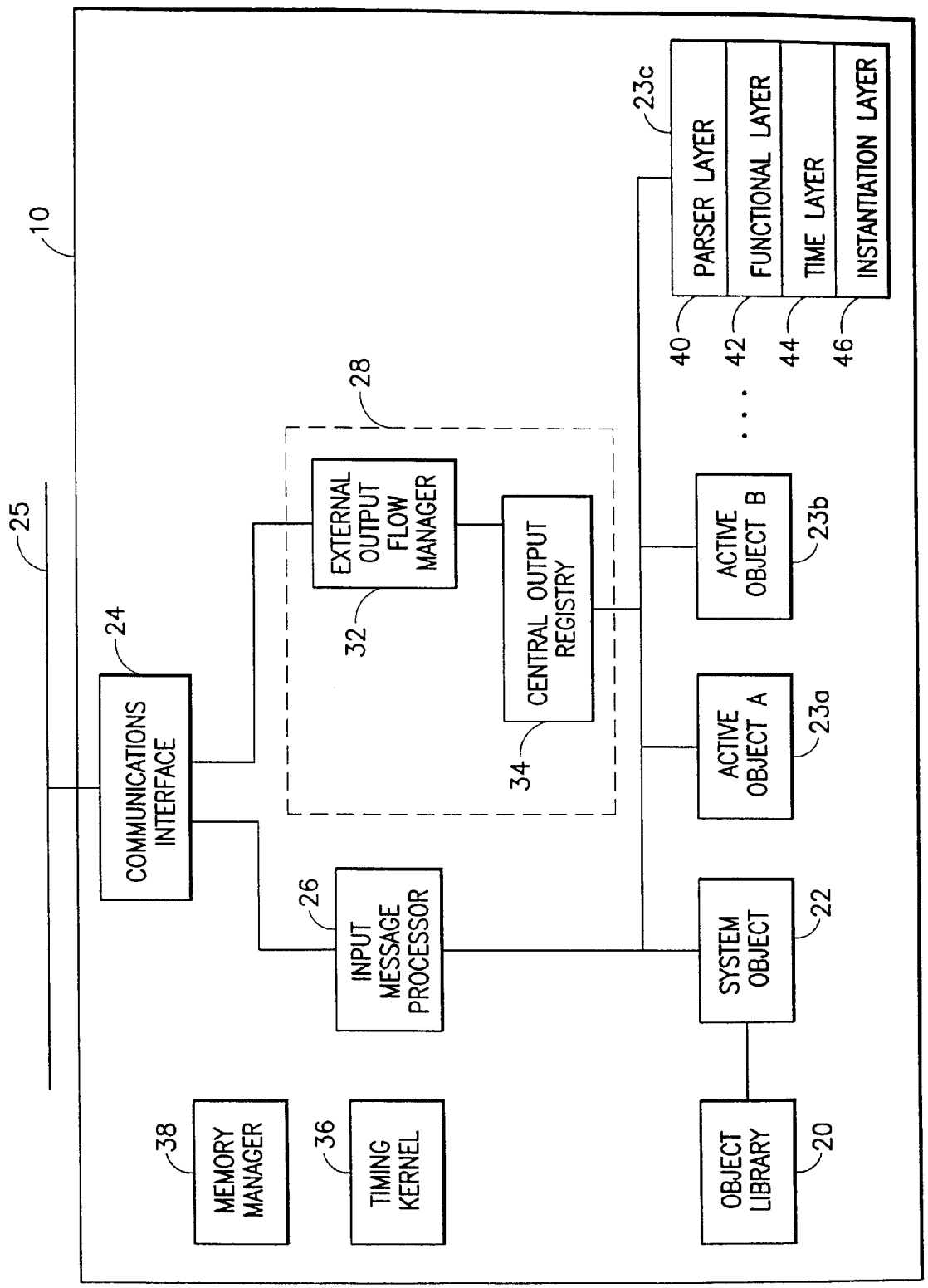
FIG. 2 is a schematic block diagram of the major functional components of an object oriented processor array according to the invention.

Turning now to FIG. 2, and with reference to FIG. 1, the readable memory 12 contains a library 20 of configurable (programmable) functions (also referred to as objects) which are instantiated and configured in the writable memory 14 as described in detail below. More specifically, the object oriented processor array 10 includes a system object 22 which is automatically instantiated in writable memory at power-up, which calls other objects from the library 20 to be instantiated in writable memory 14 in response to commands from a host processor or a boot ROM as described in more detail below. Once an object has been instantiated, it appears as an active object, e.g. 23a, 23b, 23c, in the processor array 10. The object oriented processor array 10 further includes a communications interface 24, an input message processor 26, and an output message processor 28. The communications interface 24 allows the array of active objects 23a–23c to communicate with other object oriented processor arrays and/or with a host processor or script server via a communications link or bus 25 (which may be in the form of a physical bus, a multi-ported memory or even a radio link). The communications interface also allows the system object 22 to receive commands from a host or boot ROM. The input message processor 26 is responsible for routing and basic syntax parsing of incoming messages. Once the message is received and deemed syntactically correct, it is routed to the parser layer of the addressed object as discussed below. The output message processor 28 preferably includes an external output flow manager 32 for handling messages from active objects in the array 10 to processors external of the array 10, and a central output registry 34 for queuing messages. All input to the output message processor 28 is through the central output registry 34. As described in more detail below, upon the occurrence of an event within an object, the object calls the central registry 34 and provides a handle to a standard structure which is entered into the output queue. The output queue is scanned by the flow managers which look for information on the output queue and the priority the object has been assigned, if any. Once a flow manager determines which object has subsequent use of the port, it consructs a message using information in the standard structure which determines the message type (e.g. data event, command ack, etc.), the name of the object that originated the message, the type or source of the data, and any data associated with the message which is derived by referencing a pointer. The newly composed message is then sent to the output port and transmitted.

As mentioned above, according to one embodiment, the object oriented processor array 10 is embodied as a virtual machine which is formed from software which runs on a microprocessor. Therefore, the software which embodies the object oriented processor array 10 is provided with a timing kernel 36 which simulates parallelism and a memory manager 38 which allocates memory to objects when they are instantiated. It will also be appreciated that when the object oriented processor array 10 is embodied as a virtual machine, the interconnections among the elements shown in FIG. 2 are not physical connections, but rather indicative of the functional relationships among the elements.

Figure 3:
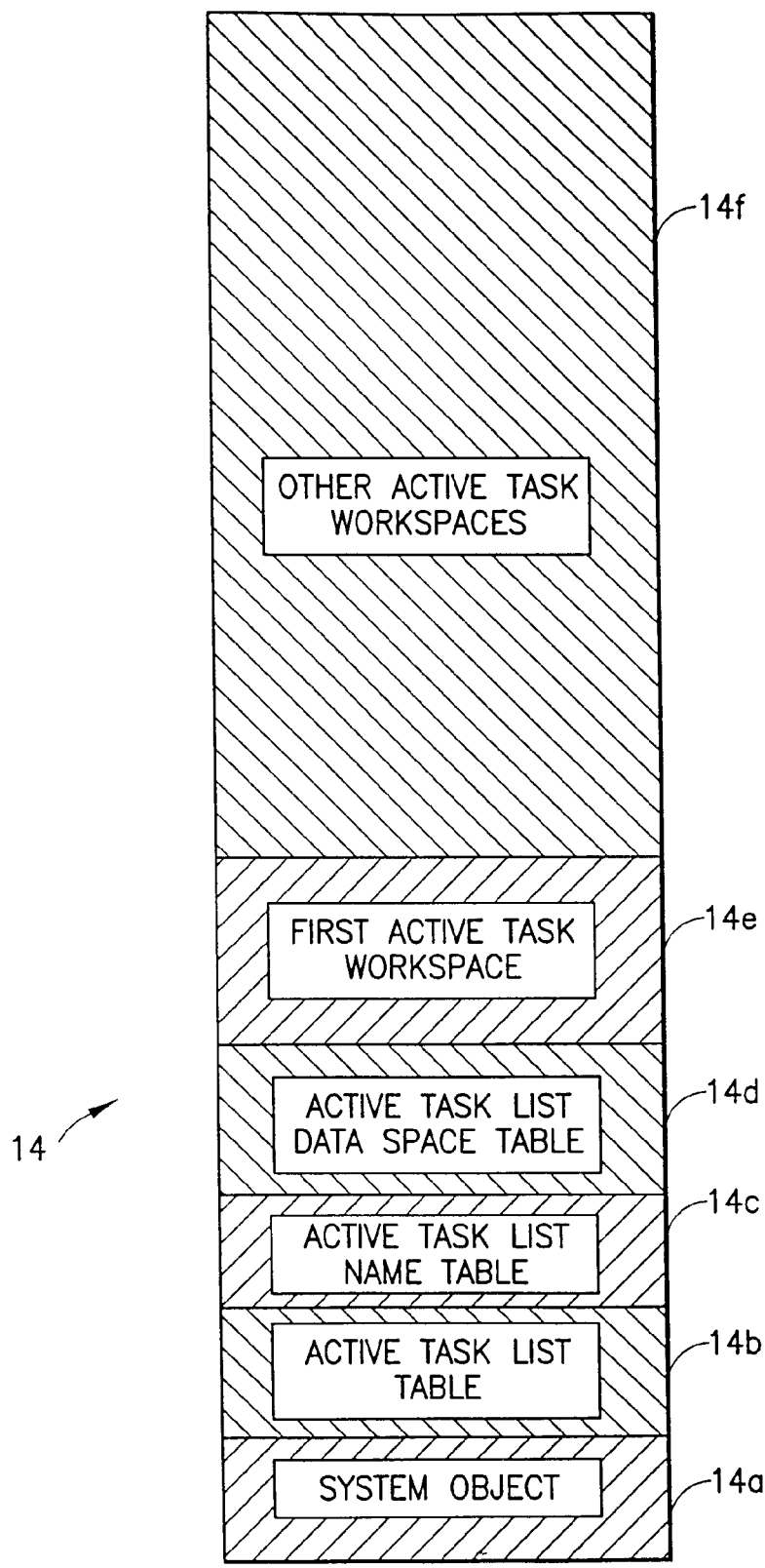
FIG. 3 is a schematic memory map of the writable memory area in the object oriented processor array of FIGS. 1 and 2.

Referring now to FIGS. 2 and 3, each object, e.g. 23c, includes a parser layer 40, a functional layer 42, a time layer 44, and an instantiation layer 46. The parser layer contains the intelligence to interpret the vocabulary pertinent to the particular object and to perform tasks which may be implemented immediately. As mentioned above, each object has a certain predefined functionality which is configurable. The vocabulary for each object, therefore, will be governed somewhat by the functionality which the object contains and will also include some general purpose vocabulary for communication. Examples of how the vocabulary of each object may be different is shown in related application Ser. No. 08/525,948. The parser layer is the means by which an instantiated object is initialized and configured, and the means by which the object receives messages. The functional layer 42 contains all of the intelligence needed to carry out the predefined functionality of the object and is preferably divided into a runtime layer and a background layer. The runtime layer contains the functionality which needs to be executed on a continual basis and the background layer contains the functionality for relatively low priority tasks. For example, if the object is coupled to an input device, scanning the input device would be part of the runtime layer. The functions performed in the background layer usually take a long time to execute such as low speed communications dialog with a device socket. The time layer 44 participates in the scheduling of the runtime layer by providing information to the system object 22 about the dynamic performance and behavior of the particular object as described more fully below. The instantiation layer 46 performs the tasks needed to instantiate the object when called by the system object as described more fully below.

As mentioned above, all of the objects, e.g. 23a–23c, are preferably stored in ROM. The system object 22 is also preferably stored in ROM and is automatically instantiated when the processor array 10 is powered on. The instantiation of the system object 22 includes reserving a portion 14a of RAM 14 for itself and reserving portions of RAM 14 for an active task list table 14b (function pointers to instantiated objects), an active task list name table 14c (the names of the instantiated objects), and an active task list data space 14d (pointers to the allocated memory blocks for each instantiated object). The system object 22 is similar to other objects but handles global methods and functions which are common to all objects (e.g., turning exception on/off, returning shell status, etc.—"shell status" includes, e.g. the number of events pending, the number of objects instantiated, etc.) and essentially consists of a parser layer only. The primary function of the system object is calling other objects to be instantiated.

Figures 2, 4:
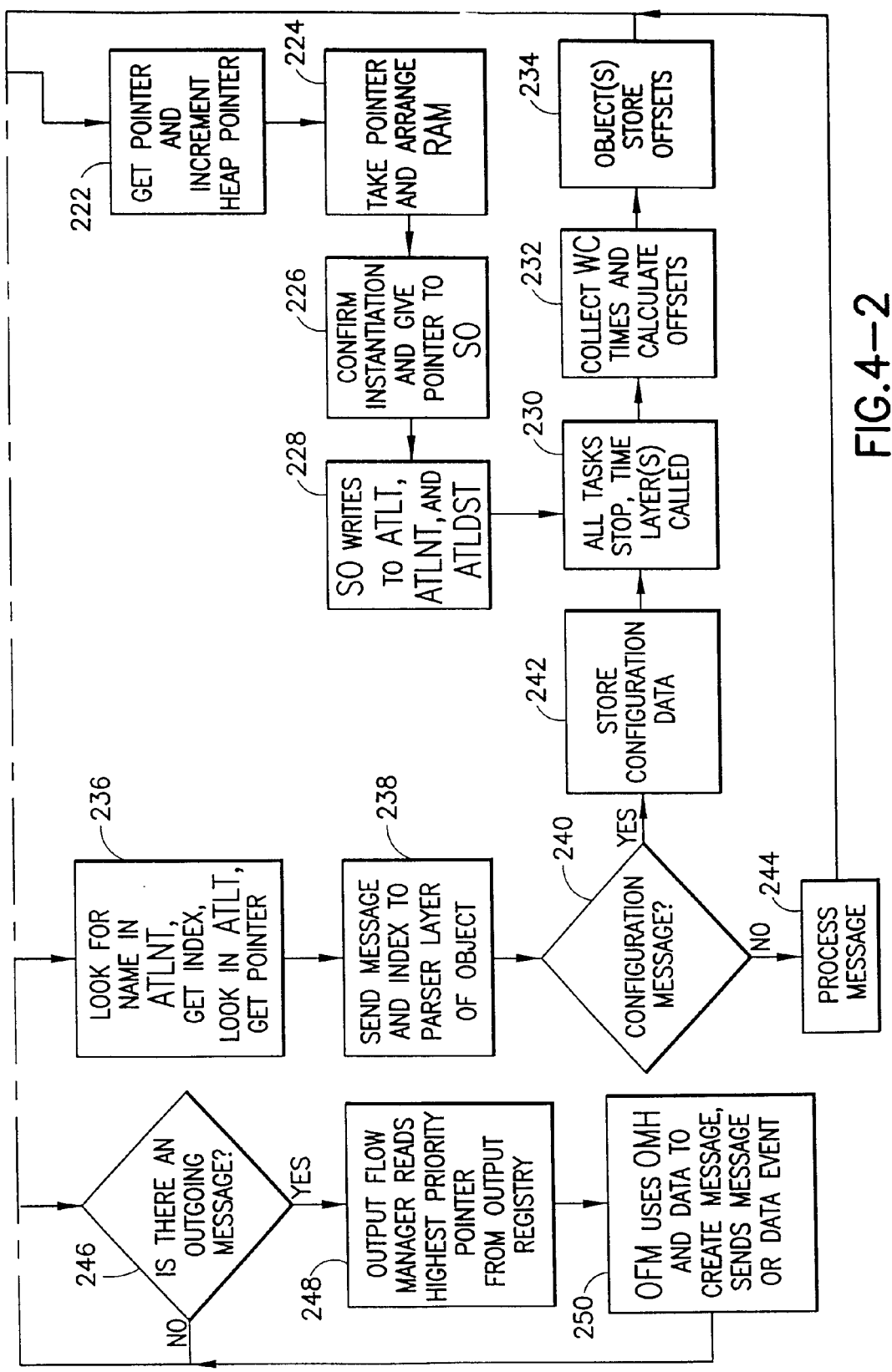
FIG. 4 is a flow chart illustrating the basic steps in the initialization, setup, and operation of the object oriented processor array of FIGS. 1 and 2.

Turning now to FIG. 4, and with reference to FIGS. 2 and 3, the initialization, configuration and operation of the object oriented processor array begins when power is applied to the array as shown at 200 in FIG. 4. Upon power on, the system object is automatically instantiated as shown at 202 in FIG. 4. The system object initiates a global variable or counter indicating that the number of active tasks =0. Each time an object is instantiated, this variable is incremented. When the variable is >0 as shown at the decision point 204 in FIG. 4, the timing kernel 36 scans the active task list table 14b as shown at 206 in FIG. 4. See, e.g., Appendix A, Timer2.c, lines 50–70. Initially, however, the only operation which occurs after the system object is instantiated is the receipt of a command message to instantiate an object. Whenever a message is received as shown at 208 in FIG. 4, the input message parser 26 checks the syntax of the message and determines at 210 whether the message is for the system object. See, e.g., Appendix B,. Imsgproc.c, lines 11–70. Although not shown in FIG. 4, if the syntax of the message is incorrect, the input message processor 26 will prepare an error message which is queued in the output registry 34. If it is determined at 210 that the incoming message is for the system. object (i.e. a command to instantiate an object), the input parser passes the command to the system object which then checks for hardware resource availability at 212 and determines whether sufficient pins are available to instantiate the object called for in the command. More particularly, the system object interrogates the instantiation layer of the object to be instantiated to determine what resources are required and then determines whether sufficient resources remain available to support an instantiation of this object. If the system object determines at 212 that (because of other object instantiations which preceded this one) there are not enough pins or enough memory to instantiate the object, it buffers an error message and sends a pointer to the output registry at 214 to return an error message to the host. Control is then returned to the timing kernel which scans the active task list at 206.

If it is determined at 212 that sufficient resources are available to instantiate the object, the system object calls at 216 the instantiation layer of the object in the object library and commands the object to instantiate itself in RAM 14. See, e.g., Appendix C, lines 262–287. The instantiation layer of the object calls (at 218 in FIG. 4) the memory manager 38 and requests an allocation (e.g. 14e) of RAM 14. The memory manager checks for the availability of RAM at 220 and if insufficient memory is available, sends an error message at 214. If enough RAM is available, the memory manager 38 returns a pointer at 222 (to a starting address in RAM) to the instantiation layer which receives the pointer and arranges its memory at 224. The memory manager also increments at 222 a heap pointer which is used by the memory manager to determine at 220 whether sufficient RAM is available for other instantiations. After the instantiation layer 46 successfully completes instantiation, it informs the system object 22 that instantiation was successful and sends the pointer to the system object at 226. When an object is instantiated, the instantiation layer arranges (at 224) its allocated RAM into organized parts. The first part is the output message header which includes a pointer to the output buffer of the object instantiation, the message length, the active task list index, the flow priority of the object instantiation, the message type, and the source ID. This first part is common to all objects, i.e. all instantiated objects arrange part of their allocated RAM in this manner. One or more other parts of RAM are arranged for private data used by the instantiated object in the performance of its functionality. It should be noted that the message flow priority is a variable which is selected by the developer and is assigned to the instantiation of the object during initialization of the array.

At 228, the system object 22 stores a pointer in the active task list table 14b which points to the portion of the ROM where the object resides. Each pointer in the active task list table is associated with an index number and the index number for the pointer is provided by the system object to the instantiation layer which stores the index number in the portion of the RAM it has configured for storage of static variables. It should be appreciated that the above described layers of the object are not copied into the RAM allocated to an instantiated object. The actual functionality of the object remains in ROM and is located by the pointer in the active task list table 14b. The RAM allocated to an instantiation of the object is used by the functionality of the object. It should also be appreciated that a particular object in the object library may be instantiated several times. In practice, each object has a functional name (which refers to the object in ROM) and an instantiated name (which refers to the instantiation of the object). The instantiated name is given as part of the high level command to the system object at the beginning of instantiation. The system object 22 also stores the instantiated name of the object in the active task list name table 14c which associates the name with the same index number as the pointer to ROM, and stores the pointer to the allocated block of RAM in the active task list data space 14d which is also associated with the same index number.

The system object 22 then recomputes the scheduling of objects in the active task list table 14b. More particularly, each time an object instantiation is completed at 228 in FIG. 4, all active tasks are stopped as shown in FIG. 4 at 230 and all instantiated objects are called to their time layer. Each instantiated object returns a worst case time to the system object at 232 and the worst case time is used to calculate an offset for each active task. Each instantiated object includes at least one active task. The system object 22 assigns the offset to each object instantiation which the time layer stores in private data at 234. The time between the worst case and the actual time is advantageously used by the system object for system (background) functions; i.e. system functions are not otherwise scheduled and therefore do not require overhead. After rescheduling in this manner is completed, the system object returns control to the timing kernel which resumes scanning the active task list at 206.

After instantiation, pins may be assigned to the instantiated object (if necessary) by sending command messages directly to the instantiated object. It will be appreciated that the functionality of a particular object may include performing certain input or output tasks which require a physical connection to an external device such as a keyboard or a display. However, some objects may have functionality which only requires communication with other objects and/ or with a host processor (as described below) in which case pins do not need to be assigned to the instantiated object. In order to assign pins to an instantiated object, messages to the instantiated object are addressed to the instantiated name of the object. For example, as shown in FIG. 4, when an incoming message is detected at 208, the input message processor 26 checks the syntax of the message, buffers the message, and examines the message to determine at 210 if the message is for the system object. If the message is not for the system object, it will be addressed to a named instantiation of an object. The input message processor looks at 236 for the named instantiation in the active task list name table 14c to determine the index number of the instantiated object to which the command is directed. Although not shown in FIG. 4, if the name cannot be found in the active task list name table, an error message will be prepared and queued with the output registry. The input message processor also scans at 236 the active task list table 14b using the index number to find the pointer to the portion of ROM which contains the layers of the object. The input message processor then forwards at 238 the message and the index number to the parser layer of the object. The parser layer of the object uses the index number to determine which instantiation of the object is being addressed and to find the pointer to the appropriate portion of RAM. The parser layer also interprets the message and determines at 240 whether the message is a configuration message, e.g., to assign pins or to set a flow priority. If it is determined at 240 that the message is a configuration message, the configuration data is stored at 242 in the appropriate portion of RAM.

If the parser layer of the object determines at 240 that the message is not a configuration message, the message is processed at 244 by the functional layer of the object and control returns to the timing kernel to scan the active task list. The functional layer of instantiated objects also may generate messages which need to be sent to another object or script server outside the array 10. Messages from an instantiation of a cell are placed in the output message header part of its RAM and a request for registration is sent to the central output registry 34. The output registry 34 maintains a queue of pointers to messages in output message header parts. The queue is scanned by one or more output flow managers (e.g. 28). See, e.g., Appendix B, Omsproc.c, lines 59–106. As shown in FIG. 4, when an outgoing message is determined at 246 to be in the queue, the output flow manager reads at 248 the highest priority pointer in the queue. The pointer points to the output message header part of RAM used by the instantiation of the object which prepared the message. The output flow manager uses the data there to prepare and send messages at 250 in FIG. 4.

As mentioned above, objects may be instantiated several times so long as enough hardware resources (pins and RAM) are available to support another instantiation. The system object 22 keeps track of all object instantiations by placing entries in the active task list table 14b, the active task list name table 14c, and the active task list data space table 14d. In addition, the memory manager 38 maintains a pointer to the memory heap which is utilized and generates an error message if requested to assign more RAM than is available. After any necessary pins have been assigned to an instantiation of an object, a message flow priority can be assigned. Alternatively, the flow priority can be assigned before pins are assigned. According to a presently preferred embodiment, a flow priority of 0–7 may be assigned where 0 represents polled priority and 1–7 indicate increasing levels of importance. When the priority level is greater than zero, output messages from the instantiated object will be generated autonomously. The flow priority is stored by the instantiation of an object in its output message header part of RAM.

Figure 4A:
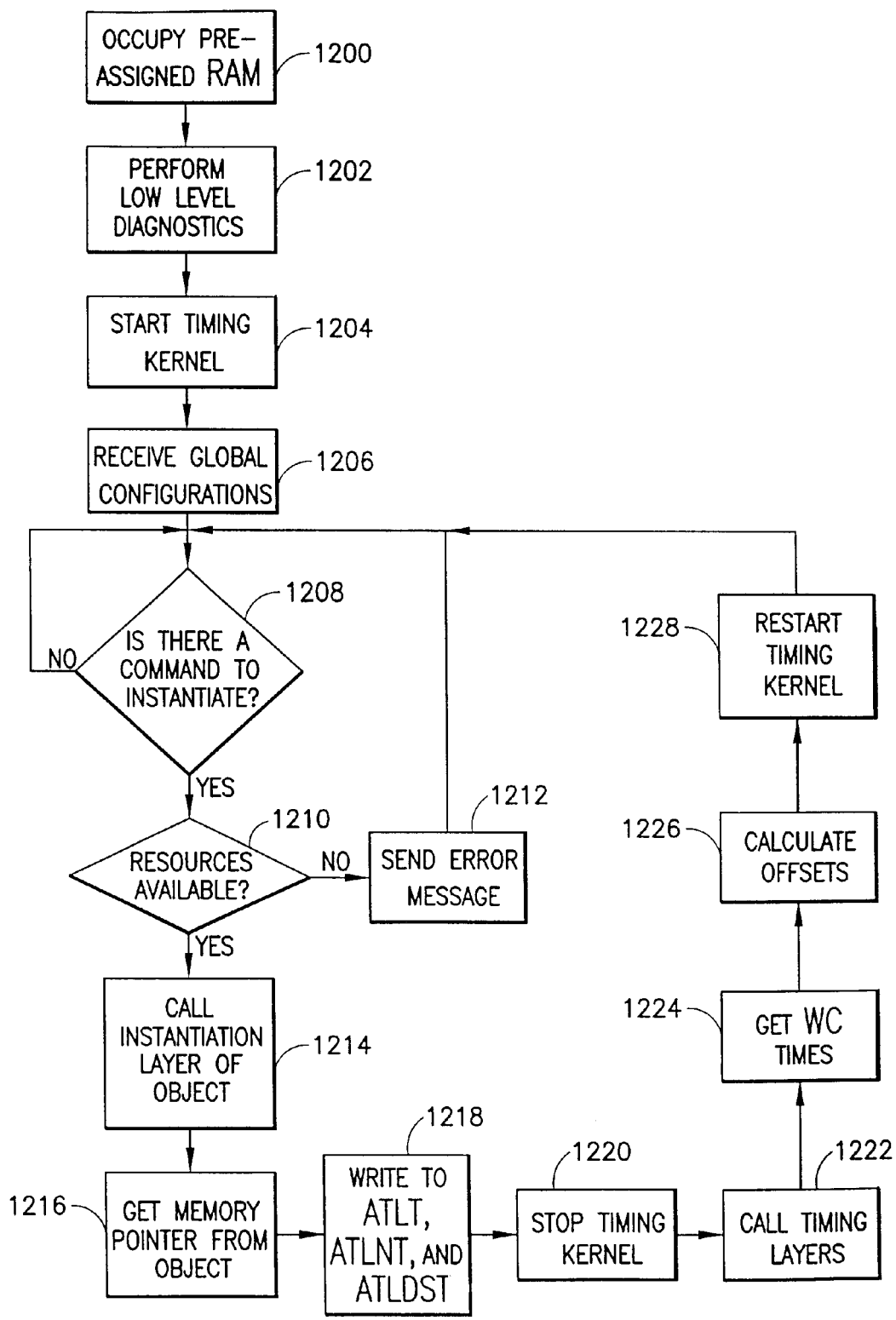
FIG. 4a is a flow chart illustrating the basic functions and operation of the system object.

As mentioned above, the system object instantiates itself automatically when power is applied to the object oriented processor array. The operations of the system object are shown in greater detail in FIG. 4a. Referring now to FIG. 4a, when power is applied to the object oriented processor array, the system object seizes a pre-assigned portion of RAM for its use, shown at 1200 in FIG. 4a. After performing low level diagnostics of the object oriented processor array at 1202, the system object starts the timing kernel at 1204. At this point, the host or the boot ROM may send global configurations to the system object, shown at 1206, such as "enable exception reporting", etc. The system object then waits at 1208 for a command from the host to instantiate an object. Upon receiving a command to instantiate an object, the system object examines the hardware resources (e.g. memory available) in the object oriented processor array to determine at 1210 whether there are sufficient resources available to instantiate this particular object. It will be understood that the system object need not be provided with the knowledge of the hardware requirements of each of the objects in the object library. If insufficient resources are available, the system object sends an error message (if exceptions are enabled) at 1212 and returns at 1208 to await a command to instantiate an object. It will be understood that in a fully developed application, e.g. where commands to the system come from a programmed ROM, there will be no errors and that the reporting of errors shown in FIG. 4a is used during the development of an application when the object oriented processor array is coupled to a host processor. If it is determined at 1210 that sufficient resources are available, the system object calls the instantiation layer of the specified object at 1214. The instantiation layer performs the tasks described above with reference to FIG. 4 at reference numerals 218 through 226 and returns its memory pointer to the system object which is shown in FIG. 4a at 1216 where the system object receives the pointer. The system object then writes to the active task lists at 1218 as described above with reference to FIG. 4 at reference numeral 228. After writing to the active task lists, the system object takes control from the timing kernal at 1220 and calls the timing layers of all instantiated objects at 1222. As explained in further detail below with reference to FIG. 4c, the timing layers report their worst case times at 1224 and the system object calculates an offset value for each instantiated object at 1226. These values are given to the objects as described above with reference to FIG. 4 at reference numeral 234. The system object then turns control back over to the timing kernel at 1228 and returns to 1208 to await any further commands to instantiate objects.

Figure 4B:
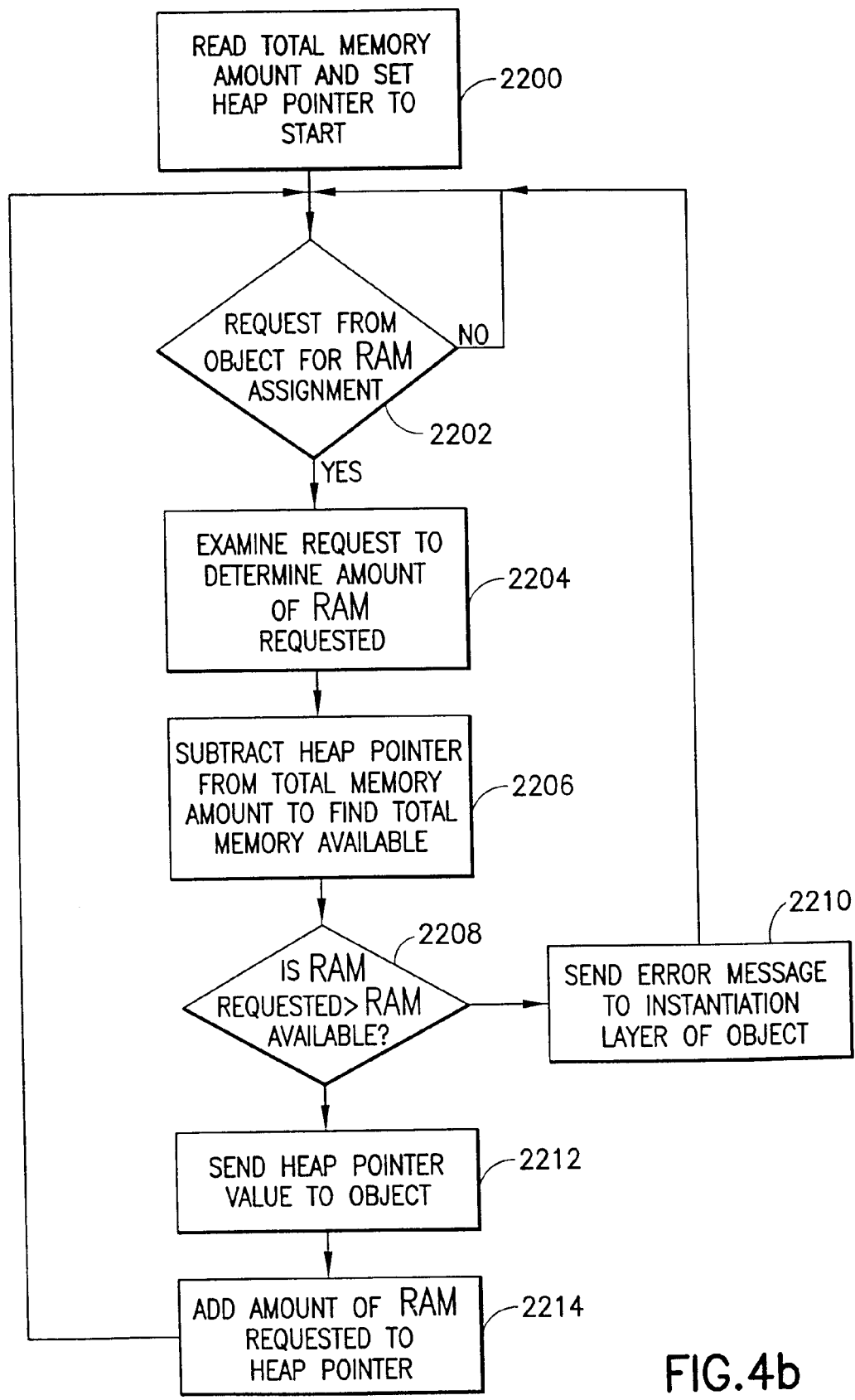
FIG. 4b is a flow chart illustrating the basic functions and operation of the memory manager.

As mentioned above, the memory manager keeps track of available RAM during the instantiation processes. More specifically, as shown in FIG. 4b, after the system object is self-instantiated, the memory manager, at 2200, reads the total memory amount of the object oriented processor array and sets the heap pointer to the next available protion of RAM beyond the portion already occupied by the system object. See also Appendix A, Main1001.c, lines 15–24, and Appendix B, Globals.h, lines 6–12. The memory manager then waits at 2202 for a request to assign RAM. When the memory manager receives a request to assign RAM from the instantiation layer of an object, it examines the request at 2204 to determine the amount of RAM requested. The memory manager finds the amount of RAM currently available at 2206 by subtracting the heap pointer from the total memory amount. The memory manager decides at 2208 if the request for RAM can be fulfilled by comparing the amount requested to the amount available. If there is insufficient RAM, the memory manager sends an error message at 2210 to the instantiation layer of the object. It will be understood that the error reporting is only used when an application is being developed. If there is sufficient RAM, the memory manager assigns RAM to the requesting object at 2212 by giving it the current location of the heap pointer. The memory manager then adjusts the location of the heap pointer by adding the requested amount of RAM to the pointer at 2214, thereby moving the pointer to the start of the portion of RAM beyond that now occupied by the instantiated object. The memory manager then returns to 2202 to await another request for RAM. The setting of the heap pointer is also shown in Appendix A.

Figure 4C:
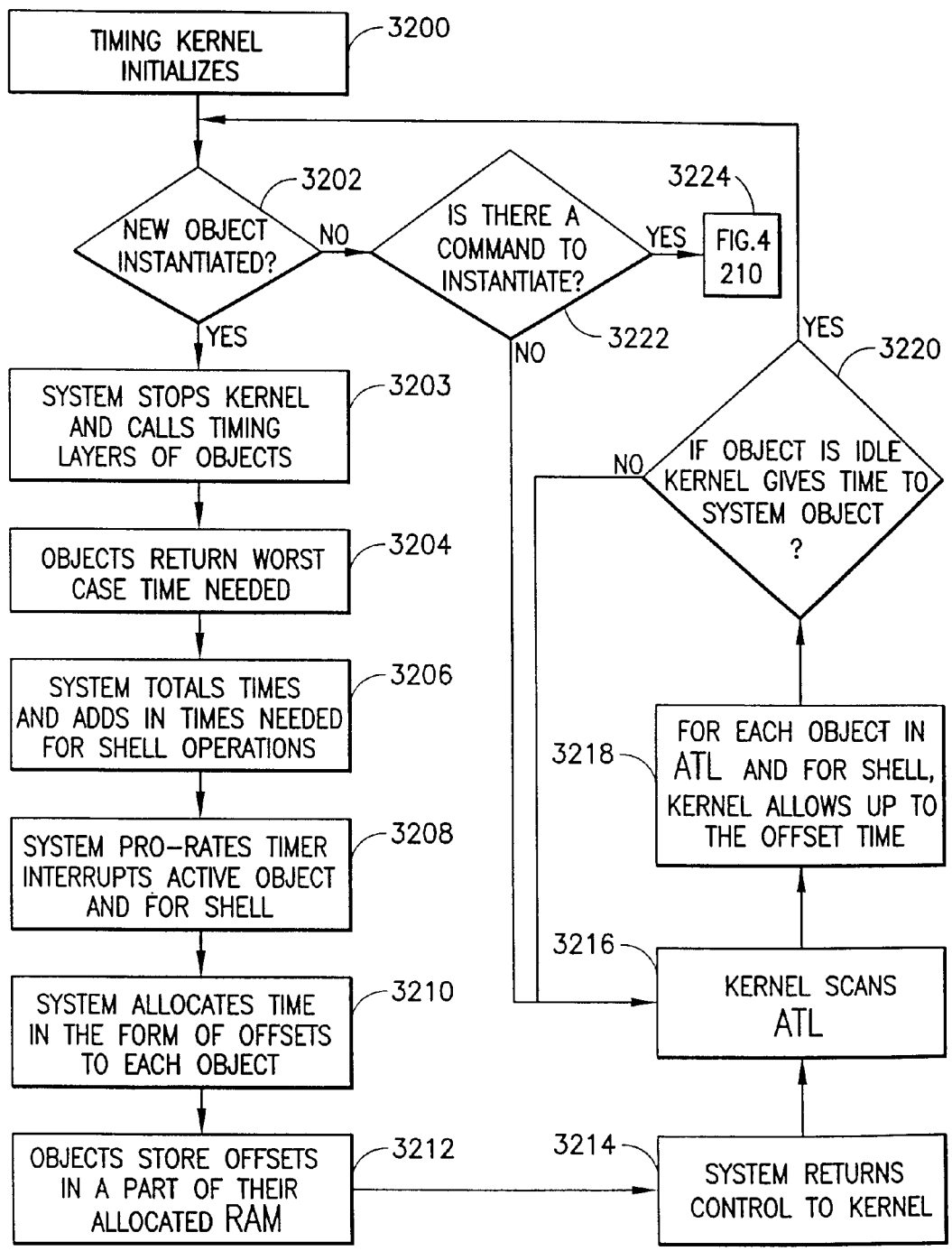
FIG. 4c is a flow chart illustrating the basic functions and operation of the timing kernel, active objects, and system object with regard to scheduling.

According to one aspect of the invention, the system object is not allocated any specific operation time by the timing kernel, nor does the system object allocate any time for its own use when performing scheduling tasks as described above with reference to FIG. 4 at 232 and 234. More particularly, as shown in FIG. 4c and by way of example in Appendix A, the timing kernal initializes at 3200 (when started by the system object as described above with reference to FIG. 4a at reference numeral 1204). See also Appendix A, Timer2.c, lines 16–52. If a new object has been instantiated at 3202, the system object takes control from the kernel at 3203 as described above with reference to FIG. 4a at reference numeral 1220. The system object collects the worst case times from all instantiated objects at 3204 as described above with reference to FIG. 4a at reference numeral 1222 and 1224. The system object then totals all of the worst case times and also adds a predefined time allocated for shell operations (i.e communications and message processing) at 3206. The times are given in terms of the system clock which will depend on the clock frequency. The Example given in Appendix A assumes a crystal frequency of 14.745 MHz and a timer interrupt every 500 microseconds or 612 cycles. The System object then pro-rates timer interrupts for each of the active objects and the shell at 3208. At 3210, the system object allocates the system clock time in the form of offsets which will be used by the timing kernel to allocate time to each active object and the shell. Each active object stores its assigned offset at 3212 in a portion of its allocated RAM. The system then returns control to the timing kernel at 3214. The timing kernel scans the active task list at 3216. For each object in the active task list, the timing kernel will allow the processor to devote a number of clock cycles to the task of that object at the appropriate time which is based on the offset for that object as shown at 3218. However, the object may not need all of the clock cycles assigned to it. For example, if the object is an input processor coupled to a keyboard or an encoder and no input activity is taking place, the object will be idle. If an object in the active task list does not need any time, the time is given to the system object at 3220. See. e.g., Appendix A, Timer2.c, lines 54–85. When the system object is given time at 3220, it looks at 3202 to see if there has been a new object instantiated. If no new object has been instantiated, the system object looks at 3222 to see if there is a command to instantiate a new object. If there has been a command to instantiate a new object, the system object calls the object's instantiation layer at 3224 as described above. If there is no command to instantiate at 3222, the timing kernal continues to scan the active task list at 3216.

Figure 5:
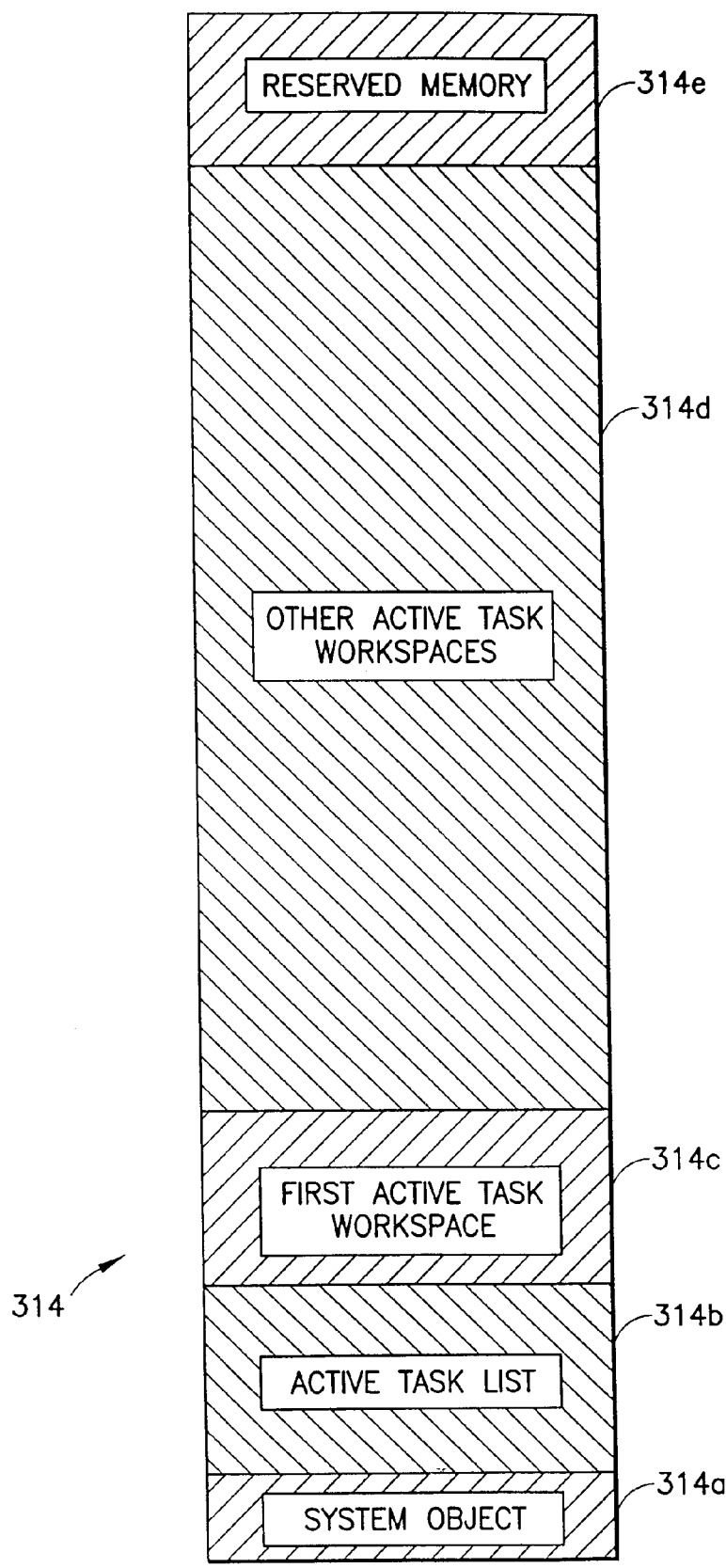
FIG. 5 is a schematic memory map of the writable memory area in an alternate embodiment of an object oriented processor array.

The object oriented processor array according to the invention may utilize memory and instantiate objects in a slightly different manner, according to an alternate embodiment. In particular, as shown in FIG. 5, the memory 314 is arranged in a slightly different manner, i.e. there is a reserved area of memory 314e in which instantiated objects store pointers as described below. The provisioning of this reserved area of memory obviates the need for an active task list name table or an active task list data space table, and only the active task list 314b is needed. However, provisioning of this reserved area can be a waste of memory which never gets used.

Figures 1, 6:
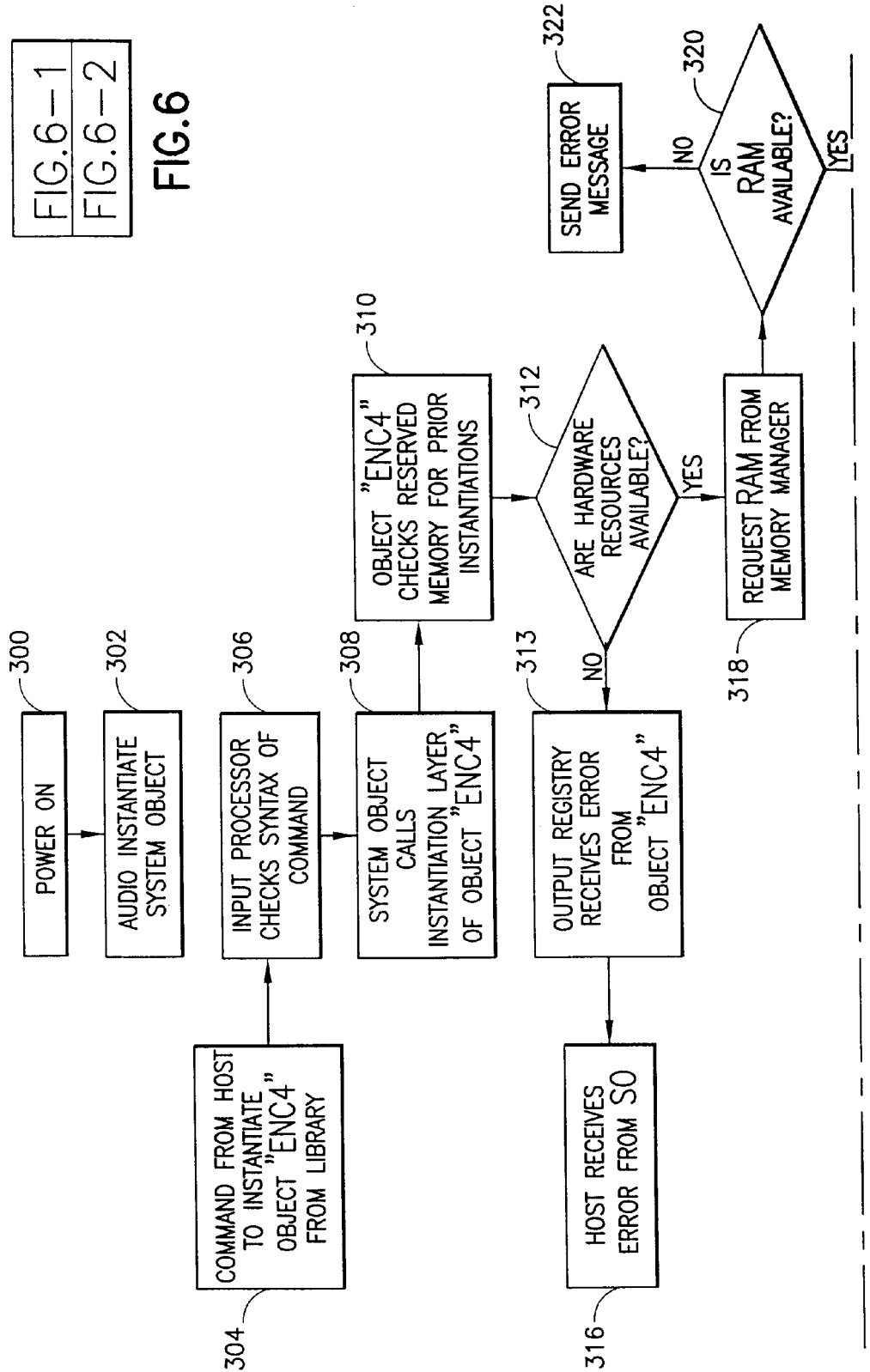
FIG. 6 is a schematic flow chart illustrating the steps in the setup programming of the alternate embodiment.
Figures 2, 6:
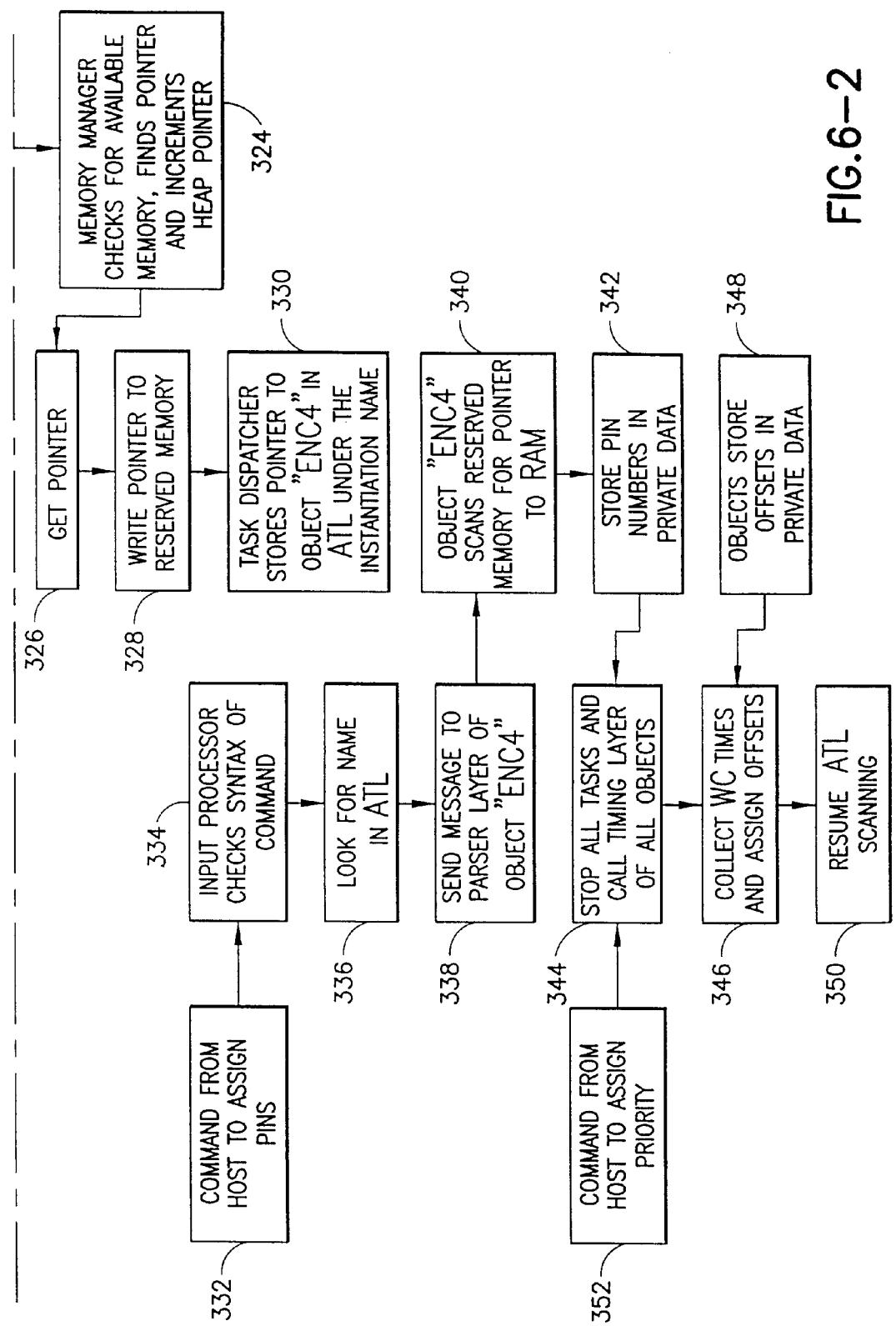

Referring now to FIGS. 5 and 6, when the object oriented processor array is powered on at 300 in FIG. 6, the system object automatically instantiates itself at 302 in FIG. 6 in a portion 314a of RAM as shown in FIG. 5. During auto-instantiation, the system object also reserves a portion of RAM 314b for maintaining an active task list, a list of pointers to objects in the object library. The object oriented processor array is thus in a condition to receive high level commands from the host or boot ROM.

An exemplary configuration command from the host to the object oriented processor array according to this alternate embodiment takes the form {zF(ENC4)}, where z is the address of the system object, F is the command to instantiate, and ENC4 is the name of a object in the object library, i.e. a 4-wide encoder. According to this alternate embodiment, the names (addresses) of the different objects are given functionally, e.g. LCDT (text LCD controller), ENC4 (4-wide encoder), KB44 (4×4 keypad controller), etc. In response to this command, given at 304 in FIG. 6, the input message processor checks the syntax of the command at 306 in and passes the command to the system object. The system object sends a call at 308 to the instantiation layer of the object "ENC4" and tells the object "ENC4" to instantiate itself. In response to the command from the system object, the instantiation layer of the object "ENC4" checks at 310 its predefined area of reserved memory 314e for prior instantiations of "ENC4" and determines at 312 whether there are sufficient hardware resources available for an(other) instantiation. According to this alternate embodiment, each object in the library is provided with a pre-coded address to a small block of RAM (a portion of 314e in FIG. 5) which is thus reserved for its use in keeping track of instantiations. If it is determined at 312 that insufficient resources are available, an error message is sent which is received by the output registry at 313 and forwarded to the host which receives an error message at 316. If it is determined at 312 that sufficient resources exist for the instantiation, the instantiation layer of "ENC4" calls the memory manager and requests at 318 an allocation of RAM sufficient for its needs. The memory manager maintains a pointer to the next byte of available memory in the "heap" as well as the address of the end of the heap. In response to a request for "n-bytes", the memory manager subtracts "n-bytes" from the end of heap address and compares the result to the heap pointer to determine at 320 whether there is enough RAM available. If sufficient RAM is not available, an error message is sent at 322 to the output registry which passes the message to the host. If it is determined at 320 that RAM is available, the memory manager, at 324, assigns the pointer to the instantiation of "ENC4" and increments the heap pointer by n-bytes. The instantiation layer of "ENC4" receives the pointer at 326 and writes the pointer at 328 to its block of reserved memory in 314e. As illustrated in FIG. 6, the pointer points to the start of memory block 314c. According to this alternate embodiment, the object "ENC4" allocates a portion of the RAM space assigned to it for output message headers and another portion of the RAM assigned to it for "private data". When the object "ENC4" has been instantiated, the task dispatcher in the system object stores a pointer at 330 to the object "ENC4" in the active task list. According to this alternate embodiment, the position in the active task list is used as the instantiation name of the instantiation of the object. For example, if the active task list has six entries (a–f), the first instantiated object will have the instantiation name "a", the second "b", the third "c", etc. Further communications with an instantiation of a object will utilize this name.

After an object has been instantiated as described above, pins can be assigned to it by the host using the command language according to the invention. For example, a command of the form {aP(B)} from the host to the object oriented processor array is directed to the instantiated object having the name "a" and utilizes the command P to assign pins where the parameter B is the location of the pins assigned to "a". As shown in FIG. 6, such a command is issued at 332. Upon receipt of such a message from the host, the input message processor checks the message at 334 for correct syntax and will generate an error message to the host if the syntax is incorrect. Based upon the address "a", the input processor will look at 336 for "a" in the active task list and direct the message to object "ENC4". According to this alternate embodiment, "a" would be the first pointer in the active task list, "b" would be the second, etc. According to the example given herein, the pointer at "a" points to the object "ENC4" and the input processor will therefore forward the message at 338 to the object "ENC4". The object "ENC4" receives the addressed message and scans its reserved memory area at 340 in FIG. 6 to find the pointer to the assigned workspace of the named instantiation of itself. The pin numbers are then stored at 342 by the object "ENC4" in the private data area of instantiation "a". Once the pins have been assigned to the instantiation "a" of the object "ENC4", the instantiation is operational and the pins are functioning with a default flow priority of zero.

Each time a new object is instantiated as described above, the timing of all tasks is recalculated. Thus, as shown in FIG. 6, the system object stops all tasks at 344 and calls the timing layer of all instantiations of objects. The instantiations respond at 346 with a worst case time to the system object and the worst case time is used to calculate the offset for the next active task. Each instantiation of a object stores at 348 its offset in the private data area of its assigned RAM. The time between the worst case and the actual time used by each object instantiation is used by the system object for background tasks. After the timing of all the tasks is recalculated, the system object returns at 350 to scanning the active task list which is described in more detail below with reference to FIG. 7. As shown in FIG. 6, timing may be recalculated in response to a host command at 352 to assign a particular priority level to a particular object instantiation. The scheduling of priorities may is performed by a scheduler which may be considered a part of the system object or a separate entity.

Figure 7:
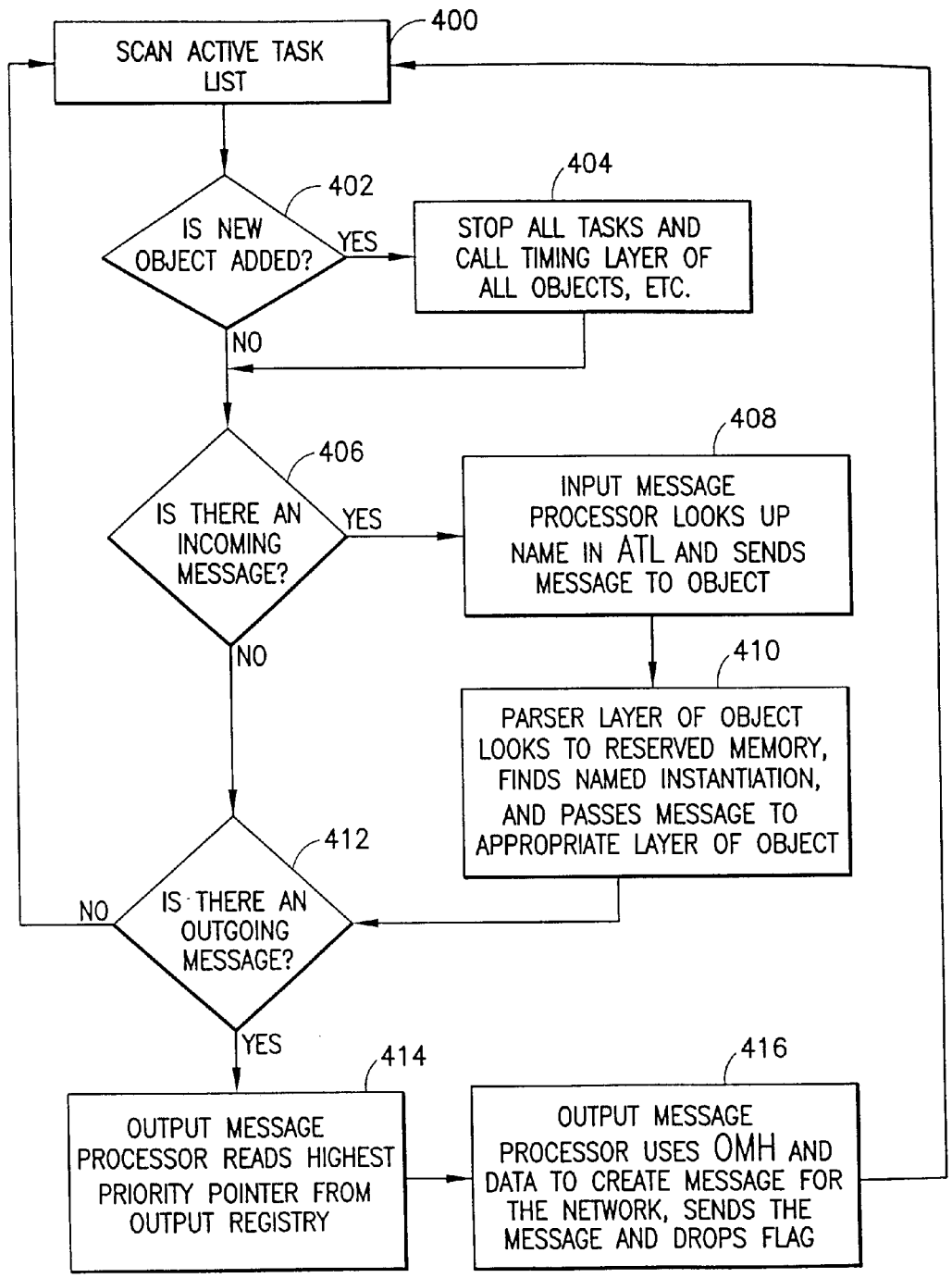
FIG. 7 is a schematic flow chart illustrating the operational mode of the alternate embodiment.

Turning now to FIG. 7, the task dispatcher of the system object continually scans the active task list starting at 400 and periodically checks at 402 whether a new object instantiation has been added. In actual practice, the scheduler sets timers for tasks based upon their priority and background tasks are completed when extra time is available. Therefore, the order of operations shown in FIG. 7 is not necessarily the order in which operations will be scheduled by the scheduler. If a new object instantiation has been added, the procedure described above (344–350 in FIG. 6) is performed at 404 in FIG. 7 and the system object then returns to scanning active tasks. This includes monitoring the output message processor and the input message processor to determine whether messages need to be delivered. For example, at 406 it is determined whether an incoming message is pending (in the buffer of the input processor). If so, the input processor examines the active task list at 408 to determine the object for which the message is addressed and passes the message to the object. The parser layer of the object examines, at 410, its preassigned reserved memory to determine which instantiation of itself should receive the message and passes the message to the appropriate layer (functional, timing, or instantiation) of the object for processing as an active task. The system object then checks at 412 whether an outgoing message is in the queue of the of the output registry. If there are messages in the queue, the output message processor reads the highest priority pointer in the output registry at 414. The pointer in the queue points to the output message header of the object generating the message. As mentioned above, the output message headers contain pointers to output buffers in RAM as well as an indication of the type of data to be sent, and a flag to indicate whether the output message header has been queued, etc. At 416, the output message former uses the output message header and the data to create a message for output onto the network sends the message and then drops the queue flag. An example of a message format according to this alternate embodiment is {ToArraytoobjMethod(data)FromObjfromarray} where the fields are delimited by case, ToArray is the processor address of the recipient, toobj is the object address of the recipient, Method is a function, data is data, and the last from fields indicate the address of the sender. If the from addressing is blank, the host is the sender. The system object then resumes scanning the active task list at 400.

Figure 8:
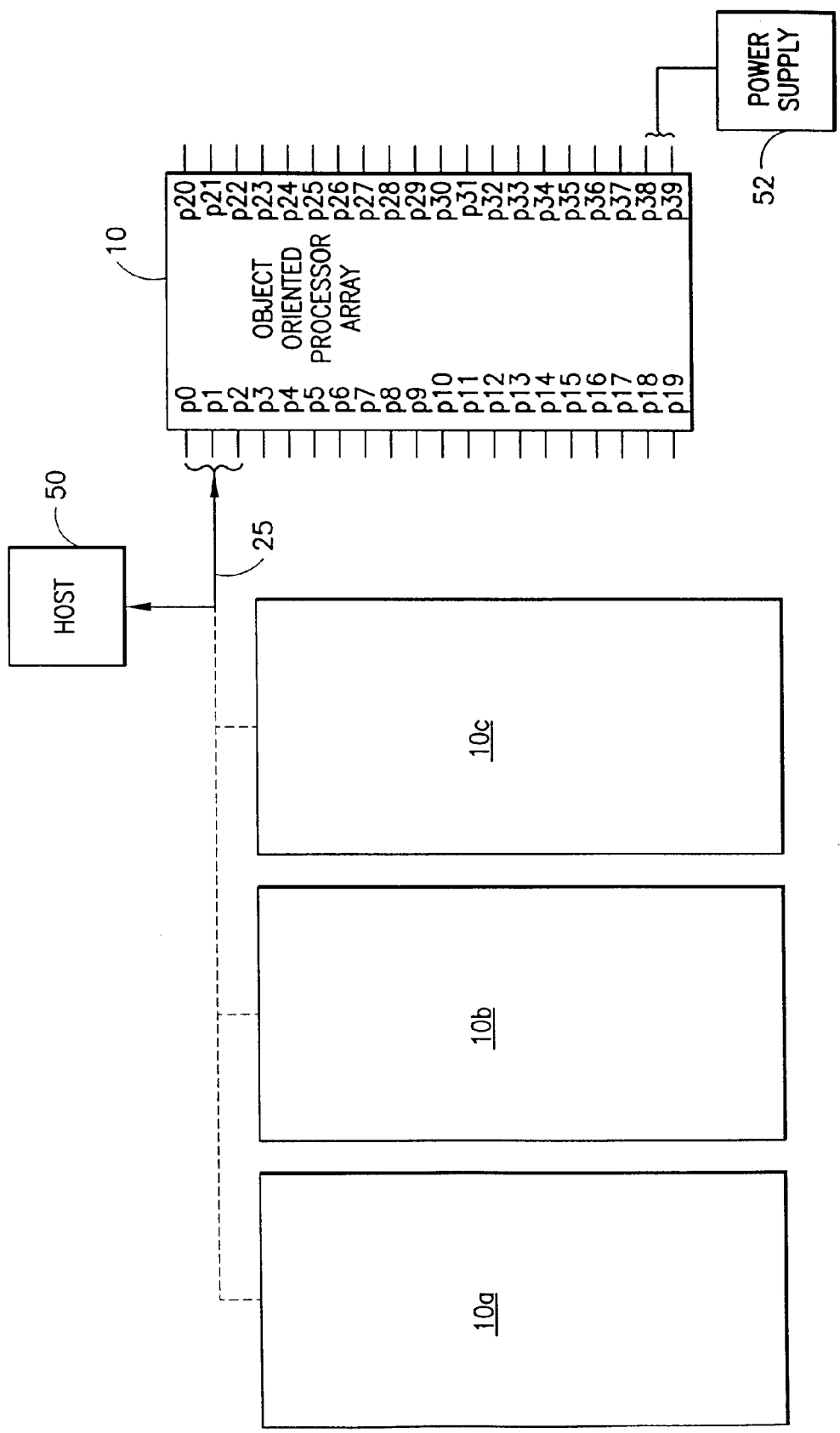
FIG. 8 is a schematic block diagram of an object oriented processor array according to the invention coupled to a host processor and a power supply.

Turning now to FIG. 8, a presently preferred embodiment of the object oriented processor array 10 is contained on a single chip having a plurality of pins, e.g., p0 through p39. Three pins, e.g. p0, p1, and p2 are preferably reserved for a communications link with a host processor 50 and additional object oriented processor arrays, e.g. 10a–10c, via a network link 25; and two pins, e.g. p38 and p39 are preferably reserved for connection to a DC power source 52. According to the presently preferred embodiment, the three pins are used to implement the communications network described in co-owned, application Ser. No. 08/645,262, filed May 13, 1996, the complete disclosure of which is incorporated by reference herein. In some instances, however, it may be advantageous to provide discrete point-to-point links between the host 50 and each array 10, 10a–10c, e.g., when the arrays are physically removed from each other by substantial distance, when the arrays are operating at substantially different speeds, or when only one array is used. In these situations, only two pins will be needed to support the link and one may use the point-to-point communication methods disclosed in co-owned, application Ser. No. 08/545,881, filed Oct. 20, 1995, the complete disclosure of which is incorporated by reference herein. It should also be noted that the host processor may also be coupled to other conventional microprocessors and/or peripheral devices to create a system which includes both distributed object oriented processing with traditional microprocessor systems.

According to the invention, the host processor 50 is used to configure the object oriented processor arrays 10, 10a–10c utilizing a high level command language and is preferably also used to communicate with the object oriented processor arrays during normal operations.

A presently preferred embodiment of a messaging language has the following syntax: <array address|message type><object name><method/data type>(<data length><data>. . .<data>). The <>indicate bytes, the ( ) are literal characters and the . . . shows that the number of data bytes may vary. The array address is five bits and for point to point communications, the array address is set to zero. The message type is three bits and presently six message types are defined. These include (1) exception, (2) data acknowledgement, (3) data event, (4) command acknowledgement, (5) polled response, and (6) command event. The object name is eight bits and is presently limited to ASCII characters @ through Z. The method/data type field is eight bits and is limited to ASCII characters a through z. This field is interpreted as a method when the message type is a command event or a command acknowledgement. There are presently five data types defined: (z) signed character, (y) unsigned character, (x) signed integer, (w) unsigned integer, and (v) floating point number. See, e.g., Appendix B, Globals.h, lines 22–35 and 55–69. The data length is eight bits and does not include the left and right parenthesis or the data length itself. The acknowledgement of commands is mandatory and the acknowledgement must echo the address fields of the command. The parsing of messages in this form is shown for example in Appendix B, Comms.c, lines 62–233.

Figure 9:
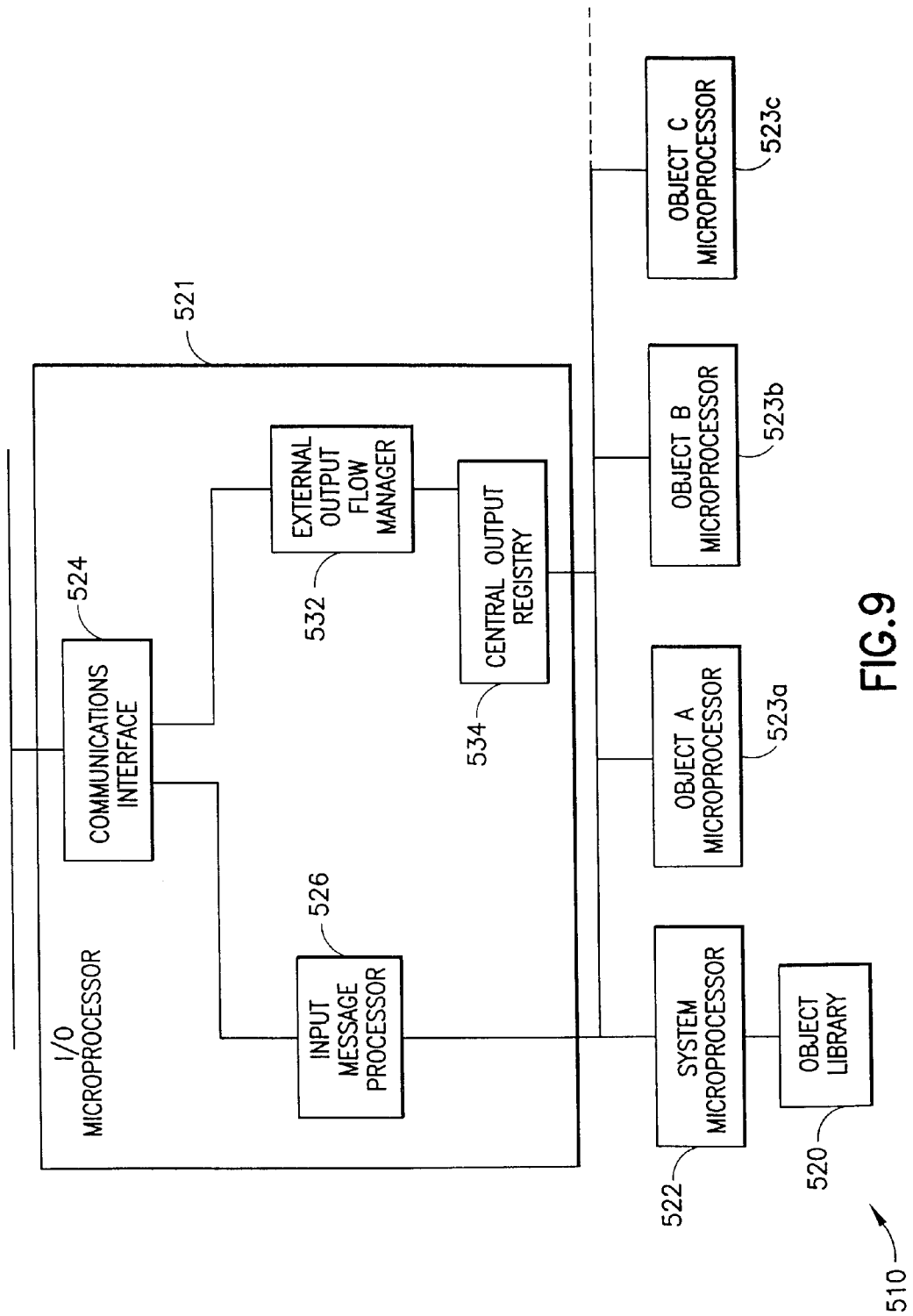
FIG. 9 is a schematic block diagram of an object oriented processor array according to the invention utilizing multiple microprocessors.

As mentioned above, the object oriented processors in the object oriented processor array may be embodied as hardware, software, or a combination of hardware and software. Turning now to FIG. 9, an object oriented processor array 510 is functionally similar to the object oriented processor array 10 shown in FIG. 2. In this embodiment, separate microprocessors 521, 522, and 523a–c . . . are provided. The microprocessor 521 is used to handle all I/O functions with respect to the array 510. The microprocessor 521, therefore provides the functionality of the communications interface 524, the input message processor 526, the external output flow manager 532, and the central output registry 534. The microprocessor 522 provides the functionality of the system object and the microprocessors 523a–c . . . provide separate processors for each instantiation of an object from the object library 520. According to one embodiment, the library contains software for each object and an object is instantiated by loading software into one of the processors 523a, etc.

Figure 10:
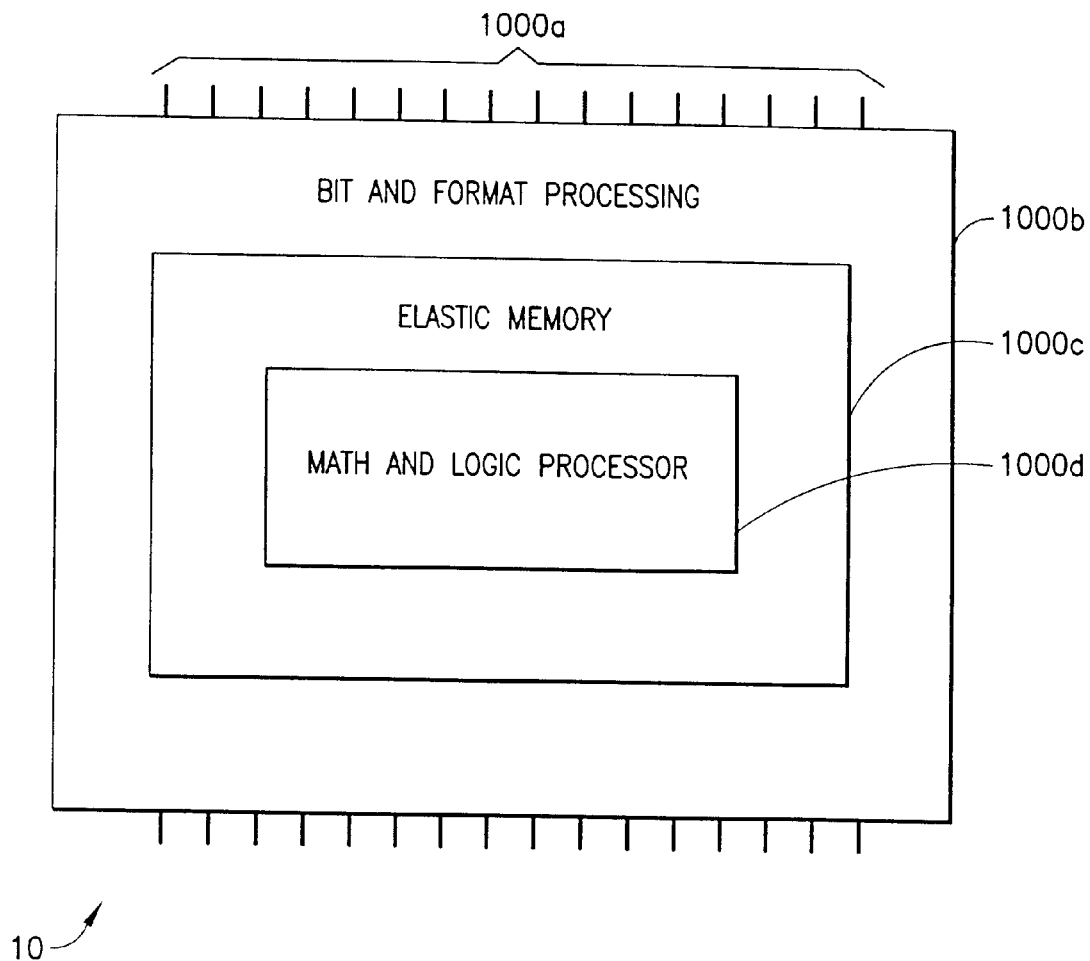
FIG. 10 is a schematic diagram generally illustrating the implementation of the object oriented processor array onto any hardware device or devices.

While, to this point, the invention has been described primarily with reference to an embodiment utilizing a microprocessor, where the objects, including the system object is implemented in software, as previously mentioned, the invention can be implemented in numerous ways, including, but not limited to programmed microprocessors, field programmable gate arrays, custom LSIs, et.. The generic concept of the invention which allows for numerous implementations is seen schematically in FIG. 10, where the object oriented processor array 10 has pins 1000a, a bit and format processing ring 1000b, an elastic memory ring 1000c, and a math and logic processing core 1000d. The pins 1000a are the actual physical link of the object oriented processor array 10 to the real world surrounding it. As will be explained in more detail below, the bit and format processing ring 1000b, the elastic memory 1000c, and the math and logic processing 1000d implement the objects, with most objects utilizing bit and format processing, memory, and math and logic processing, and with some objects utilizing only bit and format processing with memory, or math and logic processing with memory.

The bit and format processing ring 1000b performs the functions of reducing the highly disparate ensemble of real word interfaces to a regular structure, where the "regular structure" is determined by whatever best fits the needs of the math and logic processing core 1000d, and high speed, low level control of external devices. Typical functions performed in the bit and format processing ring 1000b include serial I/O, parallel I/O, specific low level control of analog to digital converters, and other processing of signals with high analog content. The implementation of the bit and format processing layer is highly variable. For example, standard microcontroller ports can be mapped into the function, although significant computing resources would be expended. Alternatively, field programmable gate array (FPGA) technology is well-suited to implementing these functions, although the use of FPGA technology is expensive in terms of circuit board area and cost. Many other implementations are possible. In particular, the bit processing portion of the bit and format processing ring can conceptually be viewed as a system which treats the input pins as a vector which is sampled at a high frequency. The act of sampling permits the bit processing to be thought of as a procedural algorithm which contains actions that enables the detection of changes of state to be determined very efficiently. Likewise, the format processing portion of the bit and format processing can be conceptually viewed as a procedural algorithm for reformatting of data for delivery to the relevant memory construct 1000c.

The elastic memory 1000c can be implemented in a broad range of manners. The implementation can include one or more of buffers, FIFOs, LIFOs or stacks, circular buffers, mail boxes, RAM, ROM, etc. The elastic memory ring 1000c can include logic for the computation of pointer locations, etc. Alternatively, this logic can be incorporated into the functionality of the bit and format processing ring 1000b on one side, and the math and logic processing core 1000d on the other side. Where code is stored for instantiation of objects, the elastic memory 1000b includes the code.

The math and logical processor core 1000d can be one or more standard processor cores (e.g. Intel® x86, Motorola® 68xxx, Intel® 8051, PowerPC™, or Analog Devices 21xx DSP) which process and transform I/O data into whatever the external device or application requires. In other words, the math and logic processing portion includes the functional layers of the various processor objects. As with the elastic memory and bit and format processing rings, the design of the math and logical processor core 1000*d* is highly application dependent.

As suggested above, typically, instantiated objects of the object oriented processor array will utilize one or more pins 1000*a*, the bit and format processing ring 1000*b*, the elastic memory 1000*c*, and the math and logic processing core 1000*d*. However, certain objects which are internal objects (e.g. an internal database object) do not necessarily need to utilize the bit and format processing ring 1000*b* or the pins 1000*a*. Similarly, other objects, such as the encoder object of Appendix C which accepts input from a rotary encoder, buffers the input, and sends the input to the script server, do not require math and logic processing. These objects require only the pins 1000*a*, the bit and format processing ring 1000*b*, and the elastic memory 1000*c*.

There have been described and illustrated herein several embodiments of an object oriented processor array. While particular embodiments of the invention have been described, it is not intended that the invention be limited thereto, as it is intended that the invention be as broad in scope as the art will allow and that the specification be read likewise. Thus, while a particular microprocessor has been disclosed with reference to the presently preferred embodiment, it will be appreciated that other off the shelf or custom microprocessors could be utilized. Also, while specific software has been shown, it will be recognized that other software code could be used with similar results obtained.

In addition, it will be appreciated that various components of the invention may be implemented in a number of different ways which may include hardware, software, or combinations of hardware and software. For example, as used herein the term "processor means" may include a discrete hardware processor or it may be a virtual processor which is implemented in software. The term "communications interface means" may include any standard communications interface such as SCSI, serial, parallel, various standard network schemes, or any proprietary communications interface. Moreover, it will be understood that in certain embodiments of the invention where some components are embodied as software, a communications interface means may be a software component which allows two software components to communicate. The "active task list means" may include a combination of hardware and software which includes memory for storing the list, routines for updating the list and scanning the list, etc. The "input message processing means may include software or hardware for interpreting messages as described herein. Finally, the means for calculating worst case time may include a processor, a subroutine, an algorithm, or in some cases, it may simply be a predefined constant stored in memory or in a line of code. Therefore, those skilled in the art will appreciate that in the realm of processor systems many different combinations of hardware and software can be used to perform the functions described herein.

It will therefore be appreciated by those skilled in the art that yet other modifications could be made to the provided invention without deviating from its spirit and scope as so claimed.

What is claimed is:

1. An object oriented processor array configurable via a message based communications link, comprising:
    a) processor means for implementing a plurality of virtual processors;
    b) a writable memory coupled to said processor means;
    c) readable memory coupled to said processor means, said readable memory containing a system object and a library of functional processor objects, each functional processor object having a predefined functionality;
    d) a plurality of physical pins for coupling at least one of said functional processor objects to an external device; and
    e) communications interface means for coupling said object oriented processor array to the message based communications link, wherein
        said system object responds to a first configuration message sent to said object oriented processor array via the message based communications link by calling a first functional processor object in said library and commanding said first functional processor object to instantiate itself as a virtual processor in said writable memory and said first functional processor object is coupled to at least one of said plurality of physical pins.

2. An object oriented processor array according to claim 1, wherein:
    said system object is automatically instantiated when power is applied to said object oriented processor array.

3. An object oriented processor array according to claim 1, wherein:
    said first functional processor object has a predefined functionality which is configurable, and
    said first functional processor object responds to a second configuration message sent to said object oriented processor array via the message based communications link by configuring its predefined functionality.

4. An object oriented processor array according to claim 1, wherein:
    said system object responds to a second configuration message sent to said object oriented processor array via the message based communications link by calling a second functional processor object in said library and commanding said second functional object to instantiate itself as a virtual processor in said writable memory.

5. An object oriented processor array according to claim 4, wherein:
    said second functional processor object has a predefined functionality which is configurable, and
    said second functional processor object responds to a third configuration message sent to said object oriented processor array via the message based communications link by configuring its predefined functionality.

6. An object oriented processor array according to claim 1, further comprising:
    f) active task list means for listing instantiated virtual processors, wherein
        said system object responds to said first functional processor object instantiating itself by listing said first functional object as an instantiated virtual processor in said active task list means.

7. An object oriented processor array according to claim 6, further comprising:
    g) input message processing means coupled to said communications interface means, to said active task list means, to said system object, and to said instantiated first functional processor object, wherein
        said input message processing means directs messages received by said object oriented processor array via the message based communications link to one of said system object and said functional processor object.

8. An object oriented processor array according to claim 1, further comprising:
   f) a memory manager coupled to said writable memory and responsive to calls from each of said functional objects, wherein
      when said system object calls one of said functional processor objects to instantiate itself in writable memory, said functional processor object called by said system object calls said memory manager, said memory manager finds a pointer to a starting address in said writable memory and gives said pointer to said functional object called by said system object, and said functional object called by said system object stores said pointer in a portion of writable memory pre-assigned to it.

9. An object oriented processor array according to claim 1, further comprising:
   f) a memory manager coupled to said writable memory and responsive to calls from each of said functional processor objects, wherein
      said system object calls a first one of said functional processor objects to instantiate itself in said writable memory with a first instantiation name,
      said first one of said functional processor objects calls said memory manager,
      said memory manager finds a first pointer to a portion writable memory and gives said first pointer to said first one of said functional processor objects,
      said first one of said functional processor objects gives said first pointer to said system object,
      said system object stores said first pointer with a first index in a memory table, stores said first index with said instantiation name in a name table, and stores said first index with said functional name of said first one of said functional objects in a task list table.

10. An object oriented processor array according to claim 1, wherein:
    said system object responds to a additional configuration messages sent to said object oriented processor array via the message based communications link by calling additional functional objects in said library and commanding said additional functional objects to instantiate themselves as virtual processors in said writable memory,
    each of said first functional object and said additional functional objects includes means for calculating a worst case time needed to perform its function,
    upon instantiation of each functional object, said system object collects the worst case time for each instantiated functional object and schedules processor time for each instantiated functional object.

11. An object oriented processor array according to claim 10, wherein:
    said system object utilizes processor time not used by instantiated functional objects which complete functions in less than worst case time.

12. An object oriented processor array according to claim 10, wherein:
    said system object schedules processor time for each instantiated functional object by assigning an offset to each instantiated functional object.

13. An object oriented processor array configurable via a message based communications link, comprising:
    a) a plurality of processor means, each of said plurality of processor means for implementing a functional processor;
    b) a writable memory coupled to each of said plurality of processor means;
    c) readable memory coupled to each of said plurality processor means, said readable memory containing a system object and a library of functional processor objects, each functional processor object having a predefined functionality, and;
    d) communications interface means for coupling said object oriented processor array to the message based communications link, wherein
       said system object responds to a first configuration message sent to said object oriented processor array via the message based communications link by calling a first functional processor object in said library and commanding said first functional object to instantiate itself with one of said plurality of processor means in said writable memory.

14. An object oriented processor array according to claim 13, wherein:
    said writable memory includes a separate writable memory coupled to each of said plurality processor means.

15. An object oriented processor array according to claim 13, wherein:
    said writable memory includes a shared writable memory coupled to each of said plurality processor means.

16. An object oriented processor array configurable via a message based communications link and for use with at least one external device, comprising:
    a) communications interface means for coupling said object oriented processor array to the message based communications link;
    b) a plurality of functional objects, each object having a predefined functionality;
    c) a plurality of physical pins for coupling at least one of said functional objects to the external device, wherein
    said pins are selectively coupled to said at least one of said functional objects in response to a message sent to said object oriented processor array via the message based communications link.

17. An object oriented processor array configurable via a message based communications link, comprising:
    a) a processor;
    b) a writable memory coupled to said processor;
    c) readable memory coupled to said processor, said readable memory containing a system object and a library of functional processor objects, each functional processor object having a predefined functionality;
    d) a plurality of physical pins for coupling at least one of said functional processor objects to the external device; and
    e) a communications interface for coupling said object oriented processor array to the message based communications link, wherein
       said system object responds to a first configuration message sent to said object oriented processor array via the message based communications link by calling a first functional processor object in said library and commanding said first functional processor object to instantiate itself as a virtual processor in said writable memory and said first functional processor object is coupled to at least one of said plurality of physical pins.

18. An object oriented processor array according to claim 17, further comprising:

f) an active task list for listing instantiated virtual processors, wherein
   said system object responds to said first functional processor object instantiating itself by listing said first functional object as an instantiated virtual processor in said active task list.

19. An object oriented processor array according to claim 18, further comprising:

g) an input message processor coupled to said communications interface, to said active task list, to said system object, and to said instantiated first functional processor object, wherein
   said input message processor directs messages received by said object oriented processor array via the message based communications link to one of said system object and said functional processor object.

20. An object oriented processor array according to claim 17, wherein:

said system object responds to additional configuration messages sent to said object oriented processor array via the message based communications link by calling additional functional objects in said library and commanding said additional functional objects to instantiate themselves as virtual processors in said writable memory, each of said first functional object and said additional functional objects includes a worst case time calculator which calculates the worst case time needed to perform its function, upon instantiation of each functional object, said system object collects the worst case time for each instantiated functional object and schedules processor time for each instantiated functional object.

* * * * *